United States Patent
Watsuda

(10) Patent No.: US 10,694,597 B2
(45) Date of Patent: Jun. 23, 2020

(54) LED PIXEL CIRCUITS WITH PWM DIMMING

(71) Applicant: InnoLux Corporation, Miao-Li County (TW)

(72) Inventor: Hirofumi Watsuda, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 16/145,589

(22) Filed: Sep. 28, 2018

(65) Prior Publication Data
US 2019/0327809 A1 Oct. 24, 2019

Related U.S. Application Data

(60) Provisional application No. 62/659,715, filed on Apr. 19, 2018.

(51) Int. Cl.
| | | |
|---|---|---|
| *H05B 45/325* | (2020.01) | |
| *G09G 3/3233* | (2016.01) | |
| *G09G 3/3258* | (2016.01) | |
| *H05B 45/10* | (2020.01) | |
| *H03K 7/08* | (2006.01) | |
| *H03K 19/20* | (2006.01) | |

(52) U.S. Cl.
CPC .............. *H05B 45/10* (2020.01); *H03K 7/08* (2013.01); *H03K 19/20* (2013.01)

(58) Field of Classification Search
CPC ....... H05B 33/0845; H03K 7/08; H03K 19/20
See application file for complete search history.

(56) References Cited

U.S. PATENT DOCUMENTS

| | | | | |
|---|---|---|---|---|
| 5,946,334 | A  * | 8/1999 | Ema | H01S 5/042 |
| | | | | 372/26 |
| 6,195,076 | B1 * | 2/2001 | Sakuragi | G09G 3/22 |
| | | | | 345/74.1 |
| 9,717,123 | B1 | 7/2017 | Yao | |
| 10,283,037 | B1 * | 5/2019 | Far | G09G 3/2011 |
| 2007/0013623 | A1 * | 1/2007 | Kimura | G09G 3/3216 |
| | | | | 345/84 |

(Continued)

FOREIGN PATENT DOCUMENTS

EP 0 365 445 A2 4/1990

OTHER PUBLICATIONS

European Search Report dated May 4, 2019, issued in application No. EP19151815.8.

(Continued)

*Primary Examiner* — Henry Luong
(74) *Attorney, Agent, or Firm* — McClure, Qualey & Rodack, LLP

(57) ABSTRACT

A pixel circuit for illuminating an LED unit with a level of brightness is provided, which includes a latch circuit, a pass switch, a PWM circuit, and a current source. The latch circuit latches control data according to a latch signal to generate a control signal. The pass switch provides the control data from a data signal to the latch circuit according to a scan signal. The PWM circuit generates a PWM signal according to the control signal and an enable signal. The current source supplies a constant current flowing through the LED unit according to the PWM signal.

19 Claims, 22 Drawing Sheets

(56) References Cited

U.S. PATENT DOCUMENTS

2009/0134814 A1      5/2009  Moon et al.
2017/0330509 A1     11/2017  Cok et al.
2018/0182279 A1*     6/2018  Sakariya .............. G09G 3/2014
2018/0301080 A1*    10/2018  Shigeta ................ G09G 3/2014

OTHER PUBLICATIONS

Extended European Search Report dated Jul. 24, 2019, issued in application No. EP 19151815.8.
"Decoders and Multiplexers;" https:jjweb.archive.orgjweb/20150311084120/http://www.dcs.gla.ac.ukj-simonjteachingjCS1Q-studentsjsystemsjonlinejsec7.html; Mar. 2015; pp. 1-10.
Webpsage: https:jjweb.archive.orgjweb/20180206044212/https:jjwww.electronics-tutorial.net/Digital-CMOS-DesignjPass-Transistor-Logic/4-1-multiplexer-using-CMOS-logic/, Feb. 2018; pp. 1-3.

* cited by examiner

LED PIXEL CIRCUITS WITH PWM DIMMING

CROSS REFERENCE TO RELATED APPLICATIONS

This application claims the benefit of U.S. Provisional Application No. 62/659,715, filed on Apr. 19, 2018, the entirety of which is incorporated by reference herein.

BACKGROUND

Field

The disclosure relates generally to circuits for driving LED units, and more particularly it relates to circuits for dimming with pulse-width modulation (PWM).

Description of the Related Art

Conventionally, an active matrix LED/OLED can be dimmed using an analog dimming method that consists of controlling the forward current that flows through an LED. However, there are some issues with the analog dimming method, which are: 1. the forward current of an LED is related to the color temperature; 2. a low forward current may result in unstable luminescence characteristics; and 3. the accuracy of the gray level depends on the accuracy of the analog control signal. In order to solve these issues, a digital technique such as pulse width modulation (PWM) may be an alternative method used for dimming an LED.

SUMMARY

In an embodiment, a pixel circuit for illuminating a first LED unit with a level of brightness is provided. The pixel circuit comprises: a first latch circuit, a first pass switch, a PWM circuit, and a current source. The first latch circuit latches first control data according to a first latch signal to generate a first control signal. The first pass switch provides the first control data from a data signal to the first latch circuit according to a scan signal. The PWM circuit generates a PWM signal according to the first control signal and an enable signal. The current source supplies a constant current flowing through the first LED unit according to the PWM signal.

In another embodiment, a driving circuit for illuminating a first LED unit with a first color and a second LED unit with a second color is provided, in which the first color and the second color are different from each other. The driving circuit comprises: a first pixel circuit and a second pixel circuit. The first pixel circuit comprises: a first latch circuit, a first pass switch, a first PWM circuit, and a first current source. The first latch circuit latches first control data according to a first latch signal to generate a first control signal. The first pass switch provides the first control data from a first data signal to the first latch circuit according to a first scan signal. The first PWM circuit generates a first PWM signal according to the first control signal and a first enable signal. The first current source supplies a first constant current flowing through the first LED unit according to the first PWM signal. The second pixel circuit comprises: a second latch circuit, a second pass switch, a second PWM circuit, and a second current source. The second latch circuit latches second control data according to a second latch signal to generate a second control signal. The second pass switch provides the second control data from a second data signal to the second latch circuit according to a second scan signal. The second PWM circuit generates a second PWM signal according to the second control signal and a second enable signal. The second current source supplies a second constant current flowing through the second LED unit according to the second PWM signal.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION

Figure 1:
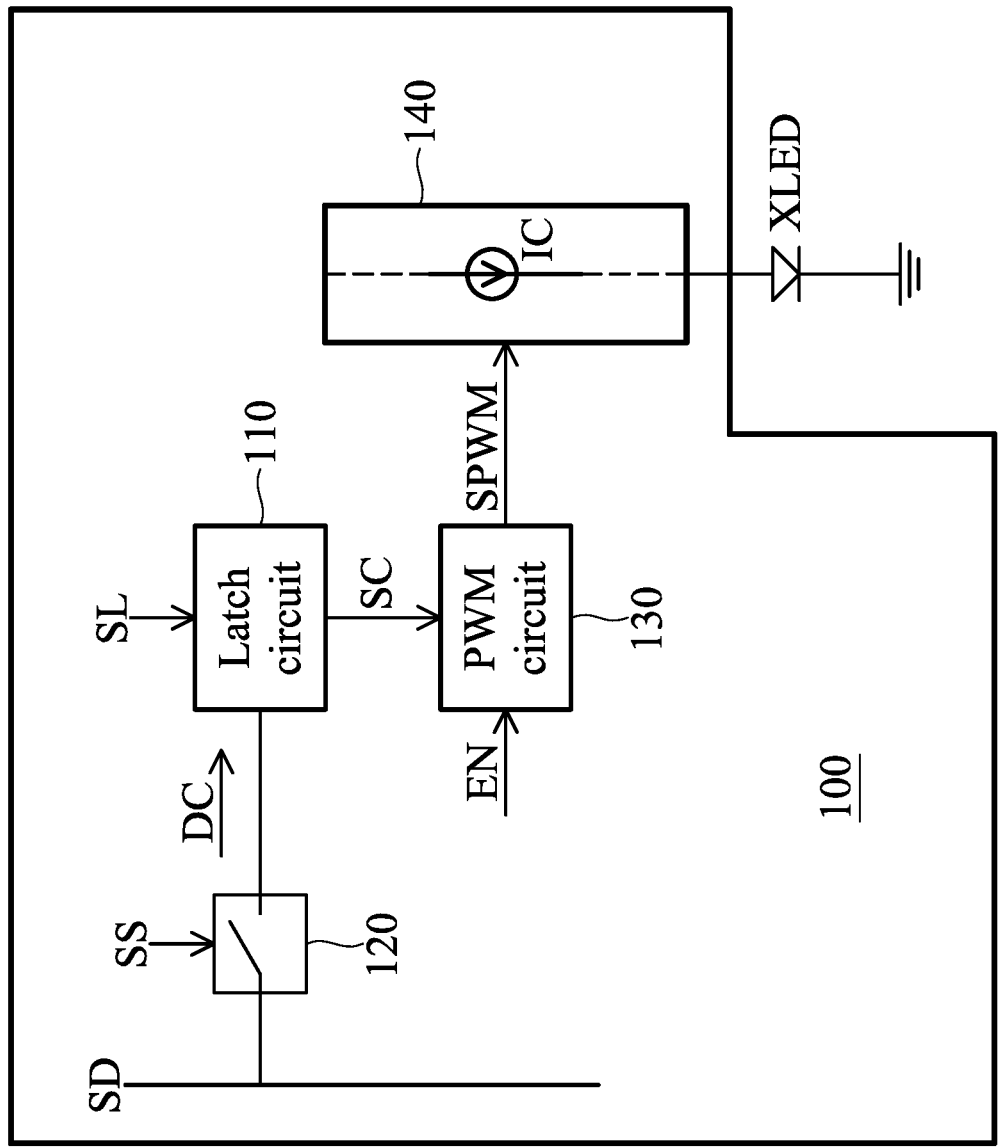
FIG. 1 is a block diagram of a pixel circuit in accordance with an embodiment of the disclosure.

This description is made for the purpose of illustrating the general principles of the disclosure and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the disclosure is best determined by reference to the appended claims.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a pixel circuit in accordance with an embodiment of the disclosure. As shown in FIG. 1, the pixel circuit 100 is configured to illuminate an LED unit XLED, which includes a latch circuit 110, a pass switch 120, a PWM circuit 130, and a current source 140.

The latch circuit 110 latches control data DC transmitted from the data signal SD according to a latch signal SL to generate a control signal SC. The pass switch 120 provides the control data DC from the data signal SD to the latch circuit 110 according to a scan signal SS. According to an embodiment of the disclosure, the pass switch 120 may be a P-type transistor. According to any embodiment of the disclosure, the P-type transistor can be replaced by an N-type transistor with some suitable modification.

The PWM circuit 130 generates a PWM signal SPWM according to the control signal SC provided by the latch circuit 110 and an enable signal EN. More specifically, the PWM circuit 130 generates the PWM signal SPWM in response to the control data DC latched by the latch circuit 110 and the enable signal EN. The current source 140 supplies a constant current IC to the LED unit XLED according to the PWM signal SPWM.

According to an embodiment of the disclosure, the control data DC, the control signal SC and the enable signal EN are N-bit, in which N is a positive integer. Each of the data lines is a data but for transmitting the data signal SD.

According to an embodiment of the disclosure, the pixel circuit 100 controls the duty cycle of the constant current IC flowing through the LED unit XLED by the PWM signal SPWM so that the LED unit XLED is illuminated with the desired level of brightness. More specifically, the level of brightness of the LED unit XLED is dimmed by the duty cycle of the PWM signal SPWM.

Figure 2:
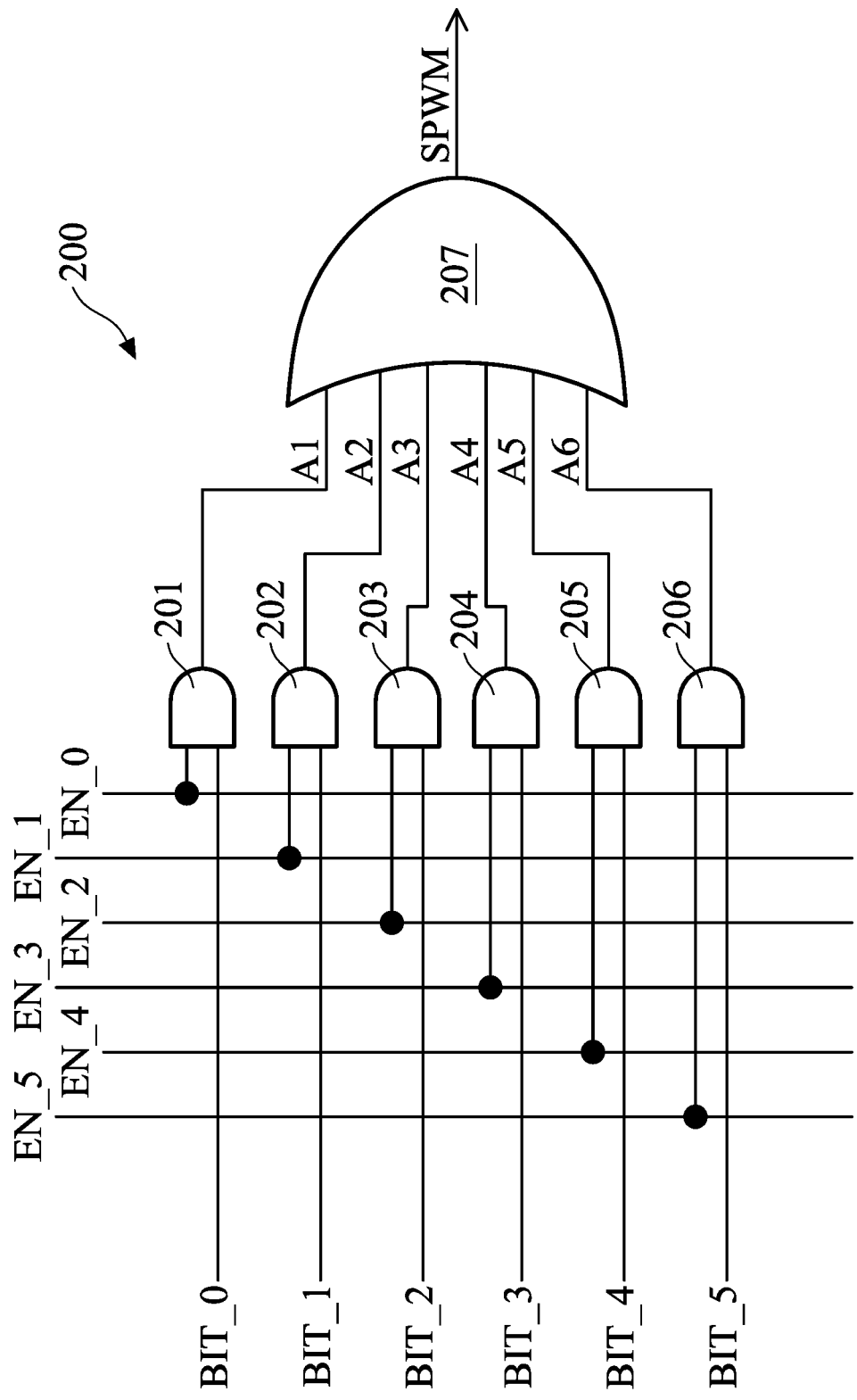
FIG. 2 is a schematic diagram of a PWM circuit 130 in FIG. 1 in accordance with an embodiment of the disclosure.

FIG. 2 is a schematic diagram of a PWM circuit 130 in FIG. 1 in accordance with an embodiment of the disclosure. As shown in FIG. 2, the control signal SC and the enable signal EN are illustrated as 6-bit for the simplicity of explanation. According to the embodiment of the disclosure, the control signal SC includes BIT_0, BIT_1, BIT_2, BIT_3, BIT_4, and BIT_5, and the enable signal EN includes EN_0, EN_1, EN_2, EN_3, EN_4, and EN_5.

As shown in FIG. 2, the PWM circuit 200 includes a first AND gate 201, a second AND gate 202, a third AND gate 203, a fourth AND gate 204, a fifth AND gate 205, a sixth AND gate 206, and an OR gate 207.

The first AND gate 201 performs the AND logic function on BIT_0 and EN_0 to generate a first result A1, the second AND gate 202 performs the AND logic function on BIT_1 and EN_1 to generate a second result A2, the third AND gate 203 performs the AND logic function on BIT_2 and EN_2 to generate a third result A3, the fourth AND gate 204 performs the AND logic function on BIT_3 and EN_3 to generate a fourth result A4, the fifth AND gate 205 performs the AND logic function on BIT_4 and EN_4 to generate a fifth result A5, and the sixth AND gate 206 performs the AND logic function on BIT_5 and EN_5 to generate a sixth result A6. The OR gate 207 performs the OR operation on the first result A1, the second result A2, the third result A3, the fourth result A4, the fifth result A5, and the sixth result A6 to generate the PWM signal SPWM.

Figure 3:
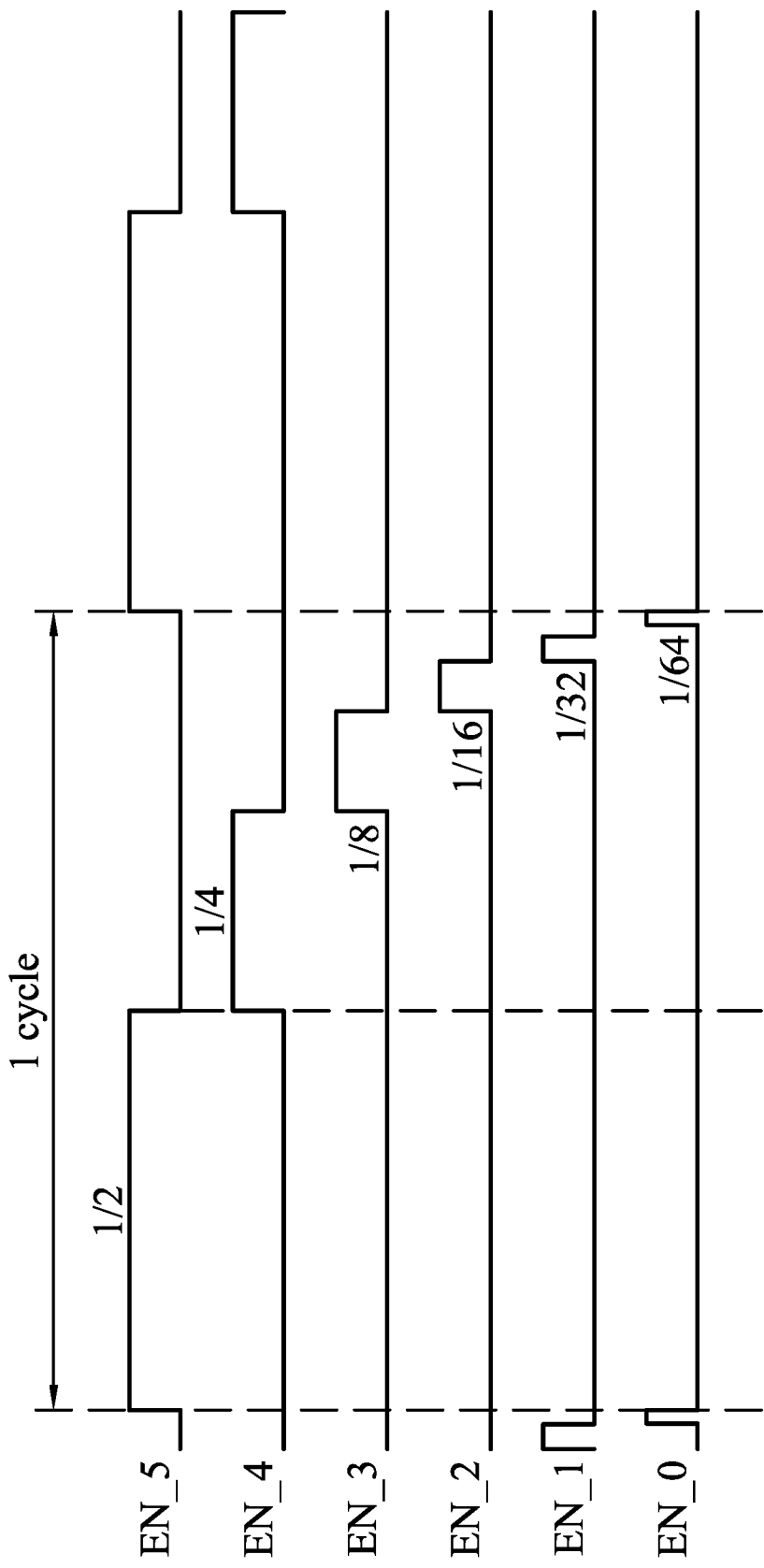
FIG. 3 illustrates a waveform of the enable signal in accordance with an embodiment of the disclosure.

FIG. 3 illustrates a waveform of the enable signal in accordance with an embodiment of the disclosure. As shown in FIG. 3, a single cycle is illustrated and the duty cycle of EN_0, EN_1, EN_2, EN_3, EN_4, and EN_5 are $1/64$, $1/32$, $1/16$, $1/8$, $1/4$, and $1/2$ respectively. Therefore, the pulse width of the PWM signal SPWM is determined by the enable signal EN and the control signal SC. According to an embodiment of the disclosure, one data frame includes one or plural cycles illustrated in FIG. 3.

Figure 4:
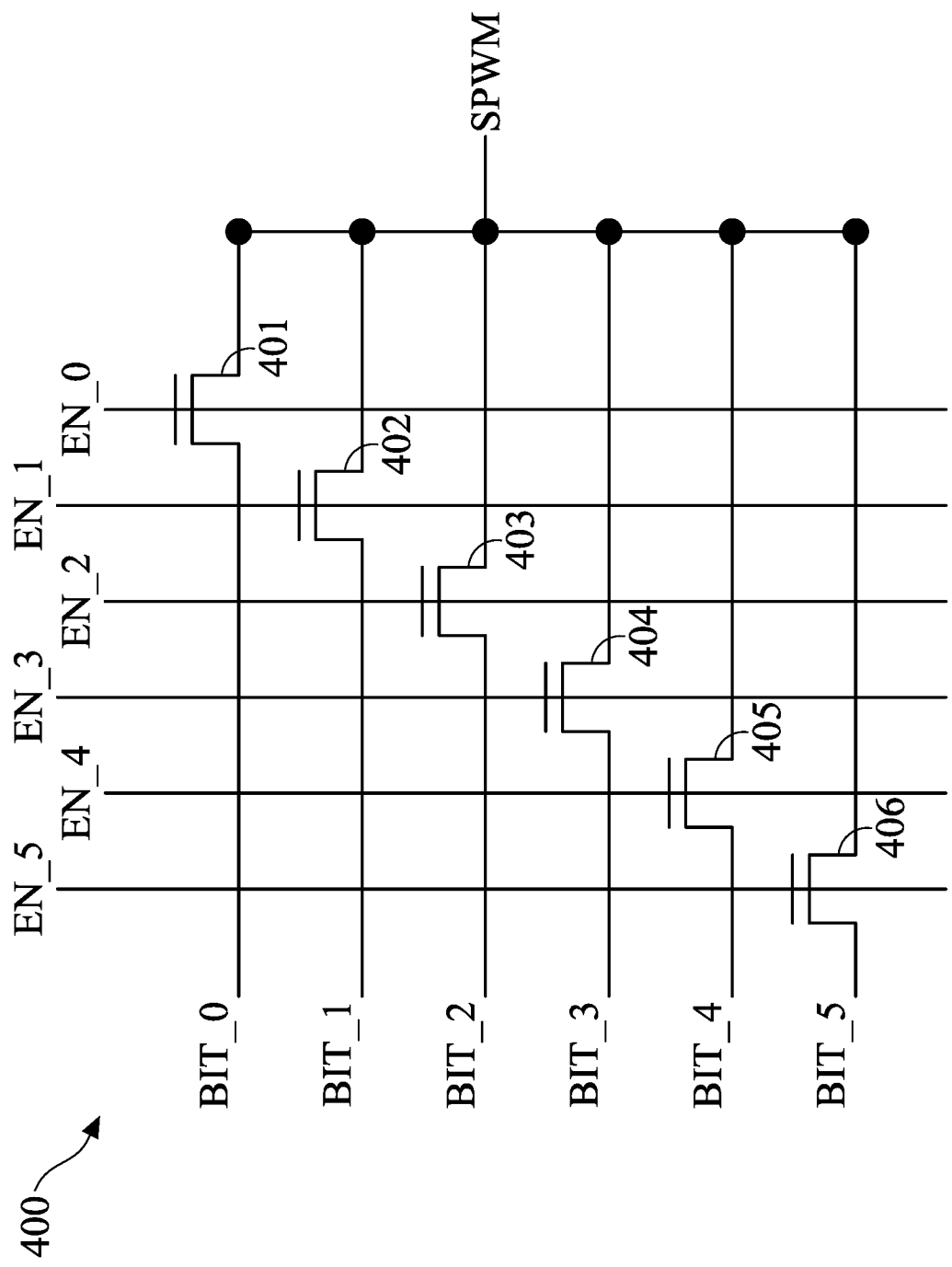
FIG. 4 is a schematic diagram of a PWM circuit 130 in FIG. 1 in accordance with another embodiment of the disclosure.

FIG. 4 is a schematic diagram of a PWM circuit 130 in FIG. 1 in accordance with another embodiment of the disclosure. As shown in FIG. 4, the control signal SC and the enable signal EN are also illustrated as 6-bit for the simplicity of explanation. The PWM circuit 400 includes a first transmission transistor 401, a second transmission transistor 402, a third transmission transistor 403, a fourth transmission transistor 404, a fifth transmission transistor 405, and a sixth transmission transistor 406.

As shown in FIG. 4, each of the transmission transistors 401-406 provides a corresponding bit of the control signal SC according to a corresponding bit of the enable signal EN, in which each bit of the enable signal EN is illustrated in FIG. 3.

Figure 5:
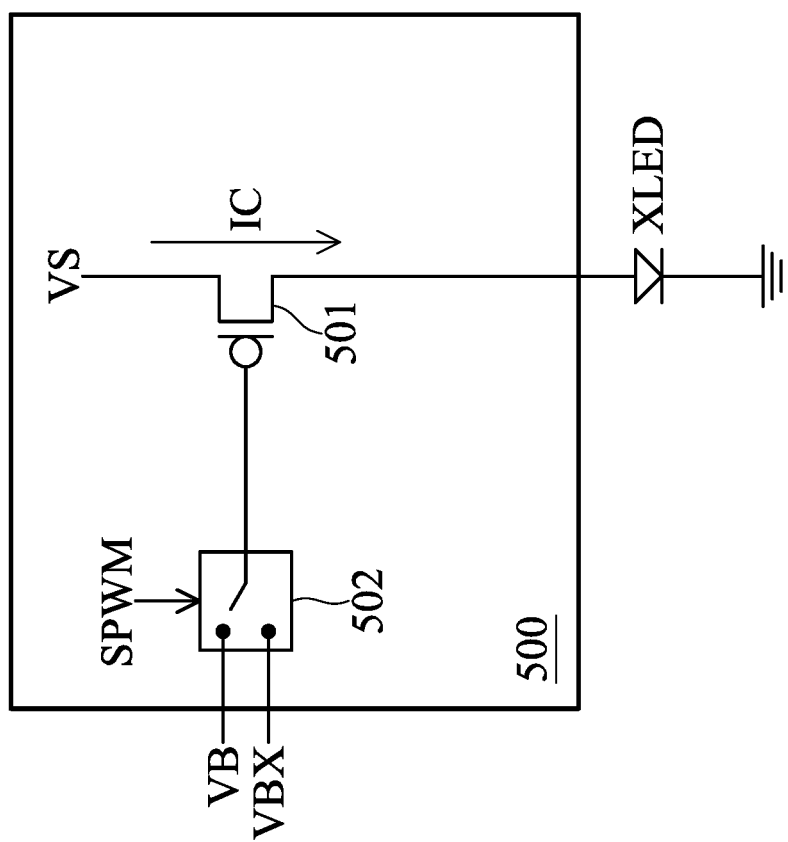
FIG. 5 is a schematic diagram of the current source in accordance with an embodiment of the disclosure.

FIG. 5 is a schematic diagram of the current source in accordance with an embodiment of the disclosure. According to an embodiment of the disclosure, the current source 500 corresponds to the current source 140 in FIG. 1.

As shown in FIG. 5, the current source 500 includes a P-type transistor 501 and a dimming switch 502. The P-type transistor 501 is configured to generate the constant current IC according to the bias voltage VB, and the constant current IC illuminates the LED unit XLED. According to an embodiment of the disclosure, the P-type transistor 501 can be replaced by an N-type transistor.

As shown in FIG. 5, the P-type transistor 501 includes a source terminal, a gate terminal, and a drain terminal, in which the source terminal of the P-type transistor 501 is supplied by a supply voltage VS, the gate terminal of the P-type transistor 501 is coupled to the dimming switch 502, and the drain terminal of the P-type transistor 501 is coupled to the LED unit XLED.

The dimming switch 502 is configured to provide the first bias voltage VB or the second bias voltage VBX to the gate terminal of the P-type transistor 501 according to the PWM signal SPWM. If the first bias voltage VB is provided to the gate terminal of the P-type transistor 501, the P-type transistor 501 is in an on state and generates the constant current IC to the LED unit XLED. If the second bias voltage VBX is provided to the gate terminal of the P-type transistor 501, the P-type transistor 501 is in an off state.

Figure 6:
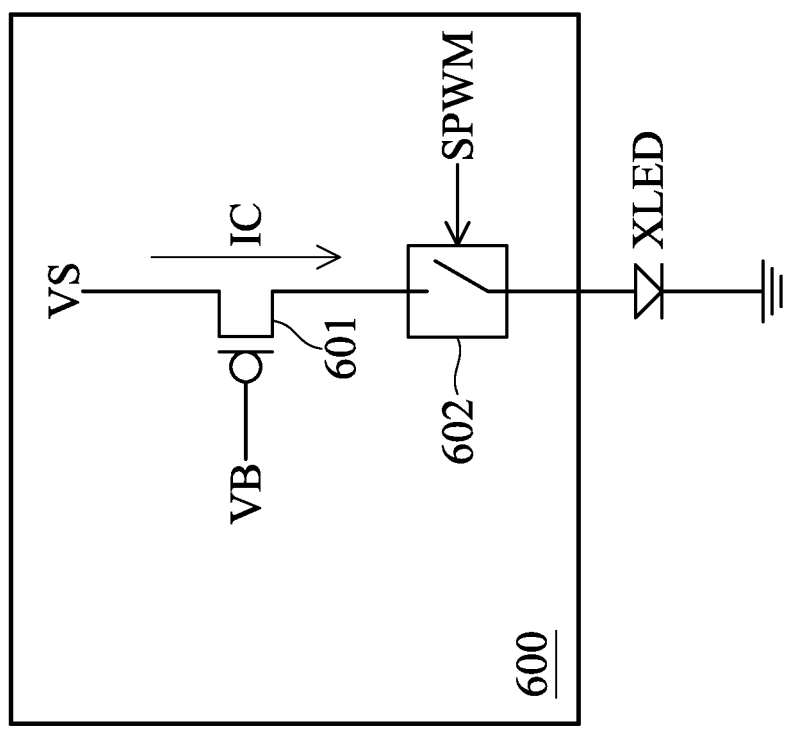
FIG. 6 is a schematic diagram of a current source in accordance with another embodiment of the disclosure.

FIG. 6 is a schematic diagram of a current source in accordance with another embodiment of the disclosure. According to another embodiment of the disclosure, the current source 600 corresponds to the current source 140 in FIG. 1.

As shown in FIG. 6, the current source 600 includes a P-type transistor 601 and a dimming switch 602. The P-type transistor 601 is configured to generate the constant current IC according to the bias voltage VB, and the constant current IC illuminates the LED unit XLED.

As shown in FIG. 6, the P-type transistor 601 includes a source terminal, a gate terminal, and a drain terminal, in which the source terminal of the P-type transistor 601 is supplied by a supply voltage VS, the gate terminal of the P-type transistor 601 is supplied by the bias voltage VB, and the drain terminal of the P-type transistor 601 is coupled to the dimming switch 602.

The dimming switch 602 is coupled between the drain terminal of the P-type transistor 601 and the LED unit XLED, which provides the constant current IC to the LED unit XLED according to the PWM signal SPWM.

Figure 7:
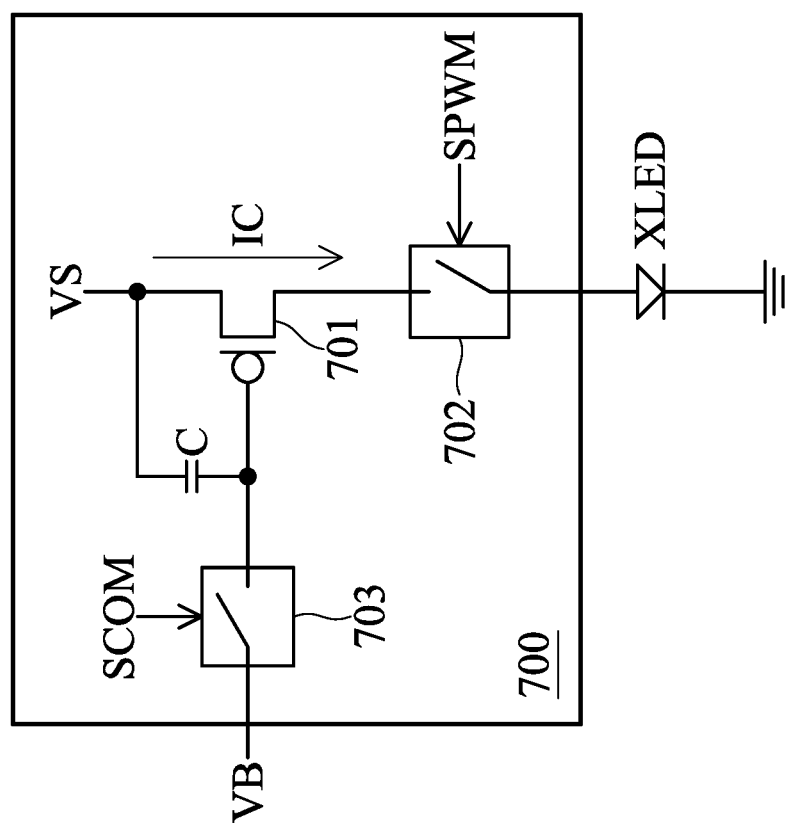
FIG. 7 is a schematic diagram of a current source in accordance with yet another embodiment of the disclosure.

FIG. 7 is a schematic diagram of a current source in accordance with yet another embodiment of the disclosure. According to yet another embodiment of the disclosure, the current source 700 corresponds to the current source 140 in FIG. 1.

As shown in FIG. 7, the current source 700 includes a P-type transistor 701, a dimming switch 702, a capacitor C, and a compensation switch 703. The P-type transistor 701 is configured to generate the constant current IC according to the bias voltage VB, and the constant current IC illuminates the LED unit XLED.

As shown in FIG. 7, the P-type transistor 701 includes a source terminal, a gate terminal, and a drain terminal, in which the source terminal of the P-type transistor 701 is supplied by a supply voltage VS, the gate terminal of the P-type transistor 701 is coupled to the compensation switch 703, and the drain terminal of the P-type transistor 701 is coupled to the dimming switch 702.

The dimming switch 702 is coupled between the drain terminal of the P-type transistor 701 and the LED unit XLED, which provides the constant current IC to the LED unit XLED according to the PWM signal SPWM.

The capacitor C is coupled between the gate terminal and the source terminal of the P-type transistor 701, which is configured to store the voltage between the source terminal and the gate terminal of the P-type transistor 701.

The compensation switch 703 provides the bias voltage VB to the gate terminal of the P-type transistor 701 according to a compensation signal SCOM, in which the constant current IC is generated in response to the bias voltage VB.

According to an embodiment of the disclosure, when the compensation switch 703 provides the bias voltage VB to the gate terminal of the P-type transistor 701, the capacitor C maintains the voltage between the source terminal and the gate terminal of the P-type transistor 701. According to another embodiment of the disclosure, when the compensation switch 703 is OFF, the constant current IC is still generated by the P-type transistor 701 based on the bias voltage VB.

According to an embodiment of the disclosure, when the constant current IC generated by the P-type transistor 701 is varied or the output power of the LED unit XLED is varied, the designer can manipulate the bias voltage VB to calibrate the constant current IC.

Figure 8:
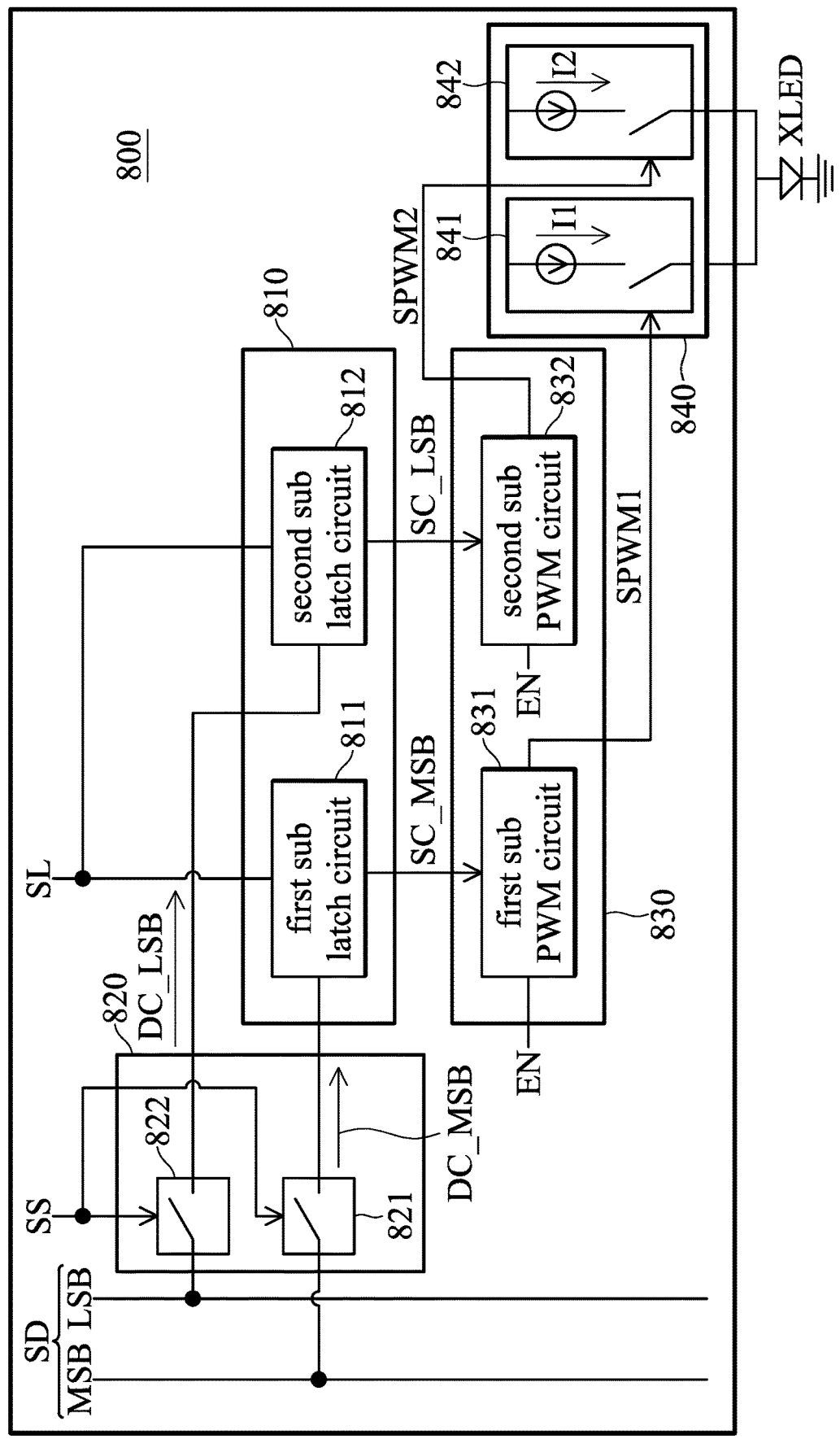
FIG. 8 is a schematic diagram of a pixel circuit in accordance with another embodiment of the disclosure.

FIG. 8 is a schematic diagram of a pixel circuit in accordance with another embodiment of the disclosure. As shown in FIG. 8, the pixel circuit 800 is configured to illuminate an LED unit XLED, which includes a latch circuit 810, a pass switch 820, a PWM circuit 830, and a current source 840.

As shown in FIG. 8, the latch circuit 810 includes a first sub latch circuit 811 and a second sub latch circuit 812. The first sub latch circuit 811 latches the MSB Most Significant Bit) control data DC_MSB from the data signal SD according to the latch signal SL to generate an MSB control signal SC_MSB. The second sub latch circuit 812 latches the LSB (Least Significant Bit) control data DC_LSB according to the latch signal SL to generate an LSB control signal SC_LSB.

According to an embodiment of the disclosure, the control data transmitted by the data signal SD is divided into two parts: the MSB control data DC_MSB and the LSB control data DC_LSB. According to an embodiment of the disclosure, the data signal SD is 10-bit. The MSB control data DC_MSB and the LSB control data DC_LSB are 5-bit respectively. According to other embodiments of the disclosure, the data signal SD is N-bit, and the MSB control data DC_MSB and the LSB control data DC_LSB are N/2-bit.

As shown in FIG. 8, the pass switch 820 includes a first sub switch 821 and a second sub switch 822. The first sub switch 821 provides the MSB control data DC_MSB from the data signal SD to the first sub latch circuit 811 according to the scan signal SS. The second sub switch 822 provides the LSB control data DC_LSB from the data signal SD to the second sub latch circuit 812 according to the scan signal SS.

The PWM circuit 830 includes a first sub PWM circuit 831 and a second sub PWM circuit 832. The first sub PWM circuit 831 generates a MSB PWM signal SPWM1 according to the MSB control signal SC_MSB and the enable signal EN. The second sub PWM circuit 832 generates an LSB PWM signal SPWM2 according to the LSB control signal SC_LSB and the enable signal EN.

The current source 840 includes a first sub current source 841 and a second sub current source 842. The first sub current source 841 supplies a first current I1 to the LED unit XLED according to the MSB PWM signal SPWM1. The second sub current source 842 supplies a second current I2 to the LED unit XLED according to the LSB PWM signal SPWM2. The second current I2 is lower than the first current I1.

According to an embodiment of the disclosure, it is assumed that the data signal SD is 10-bit, that the MSB control data DC_MSB is 5-bit, and that the LSB control data DC_LSB is 5-bit. The first current I1 is 31 times the second current I2. According to other embodiments of the disclosure, it is assumed that the data signal SD is N-bit, that the MSB control data DC_MSB is $$\frac{N}{2} - \text{bit},$$

and that the LSB control data DC_LSB is $$\frac{N}{2} - \text{bit}.$$

The first current I1 is $(2^{N/2}-1)$ times the second current I2.

Figure 9:
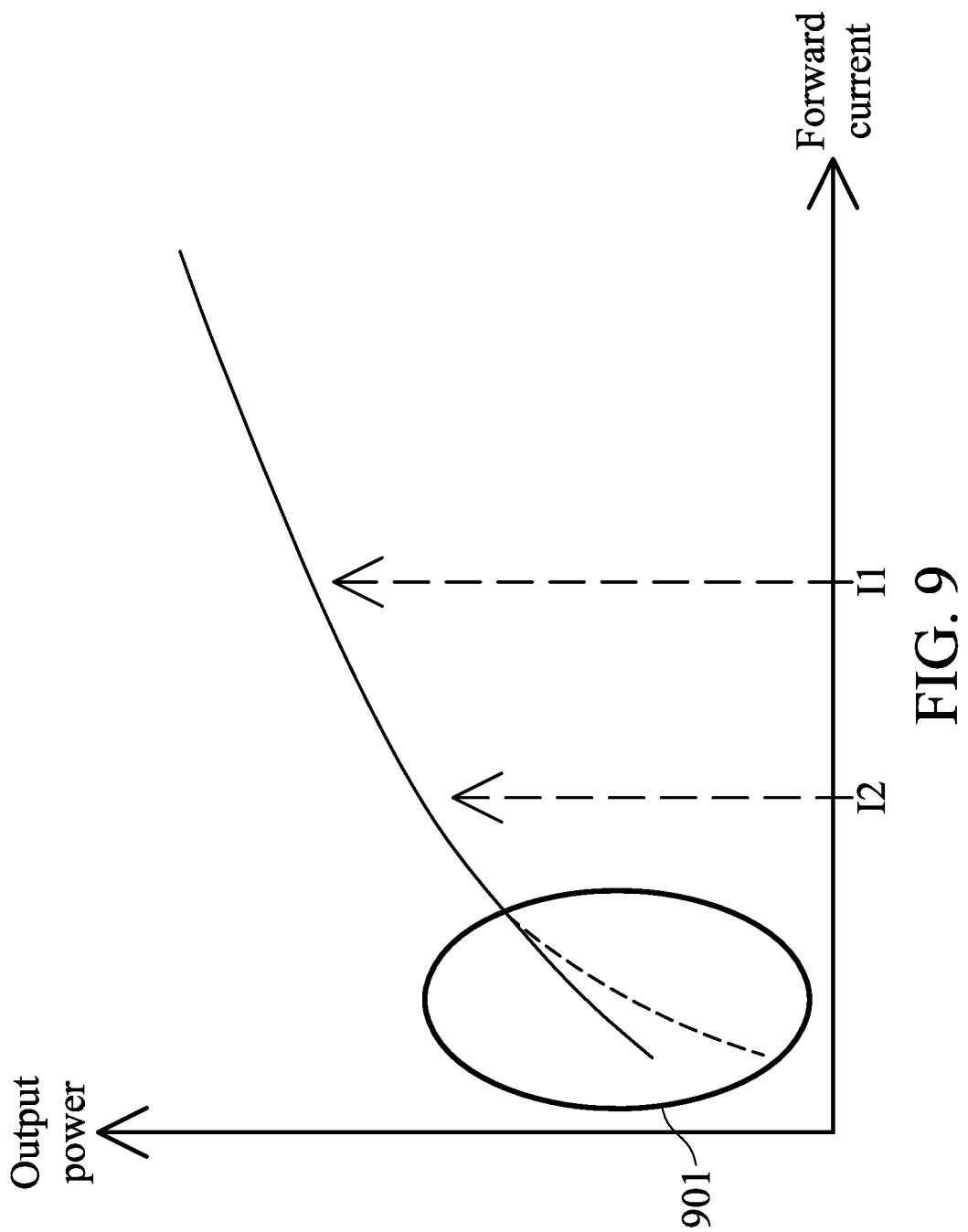
FIG. 9 shows the characteristics of an LED unit in accordance with an embodiment of the disclosure.

FIG. 9 shows the characteristics of an LED unit in accordance with an embodiment of the disclosure. As shown in FIG. 9, the X-axis is the forward current flowing through an LED unit, and the Y-axis is the output power generated by the LED unit. The unstable output region 901 indicates a nonlinear operation region of the LED unit, and the LED unit preferably, but is not limited to, is operated away from the unstable output region 901. I1 and I2 in FIG. 9 correspond to the first current I1 and the second current I2 in FIG. 8.

Since the second current I2 is very close to the unstable output region 901, the second current I2 should be greater for ensuring the operation of the LED unit XLED far from the unstable output region 901 so that the output power of the LED unit XLED would be proportional to the forward current flowing through the LED unit XLED.

Figure 10:
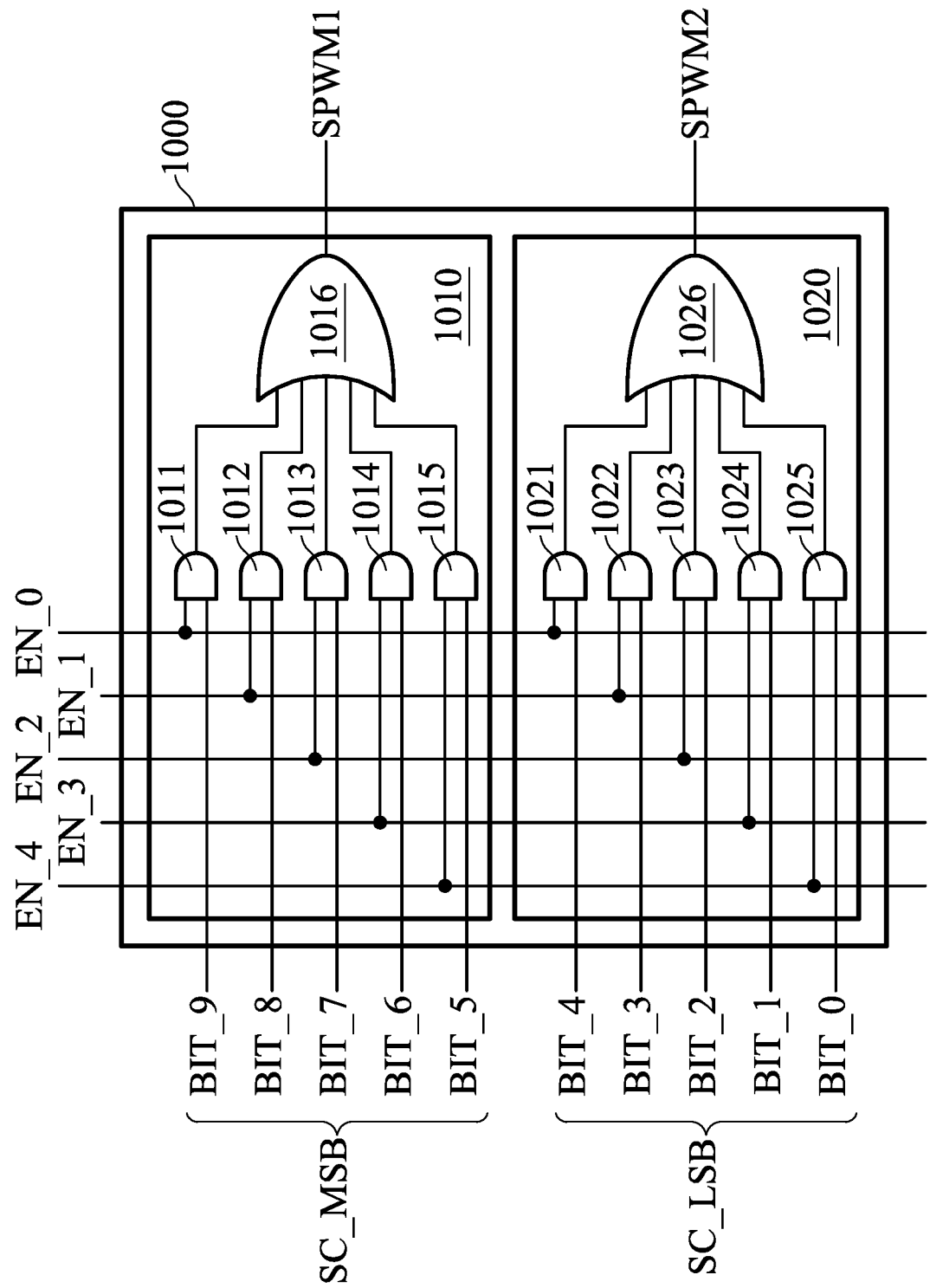
FIG. 10 is a schematic diagram of the PWM circuit 830 in FIG. 8 in accordance with an embodiment of the disclosure.

FIG. 10 is a schematic diagram of the PWM circuit 830 in FIG. 8 in accordance with an embodiment of the disclosure, in which the enable signal EN, MSB control signal SC_MSB, and the LSB control signal SC_LSB are illustrated as 5-bit. More specifically, the MSB control signal SC_MSB includes BIT_9, BIT_8, BIT_7, BIT_6, and BIT_5, and the LSB control signal SC_LSB includes BIT_4, BIT_3, BIT_2, BIT_1, and BIT_0.

As shown in FIG. 10, the PWM circuit 1000 includes a first sub PWM circuit 1010 and a second sub PWM circuit 1020, in which the first sub PWM circuit 1010 corresponds to the first sub PWM circuit 831 and the second sub PWM circuit 1020 corresponds to the second sub PWM circuit 832. The first sub PWM circuit 1010 includes 5 AND gates 1011-1015 and an OR gate 1016, which perform logic operations on the MSB control signal SC_MSB and the enable signal EN to generate the MSB PWM signal SPWM1.

The second sub PWM circuit 1020 includes 5 AND gates 1021-1025 and an OR gate 1026, which perform logic operations on the LSB control signal SC_LSB and the enable signal EN to generate the LSB PWM signal SPWM2.

Figure 11:
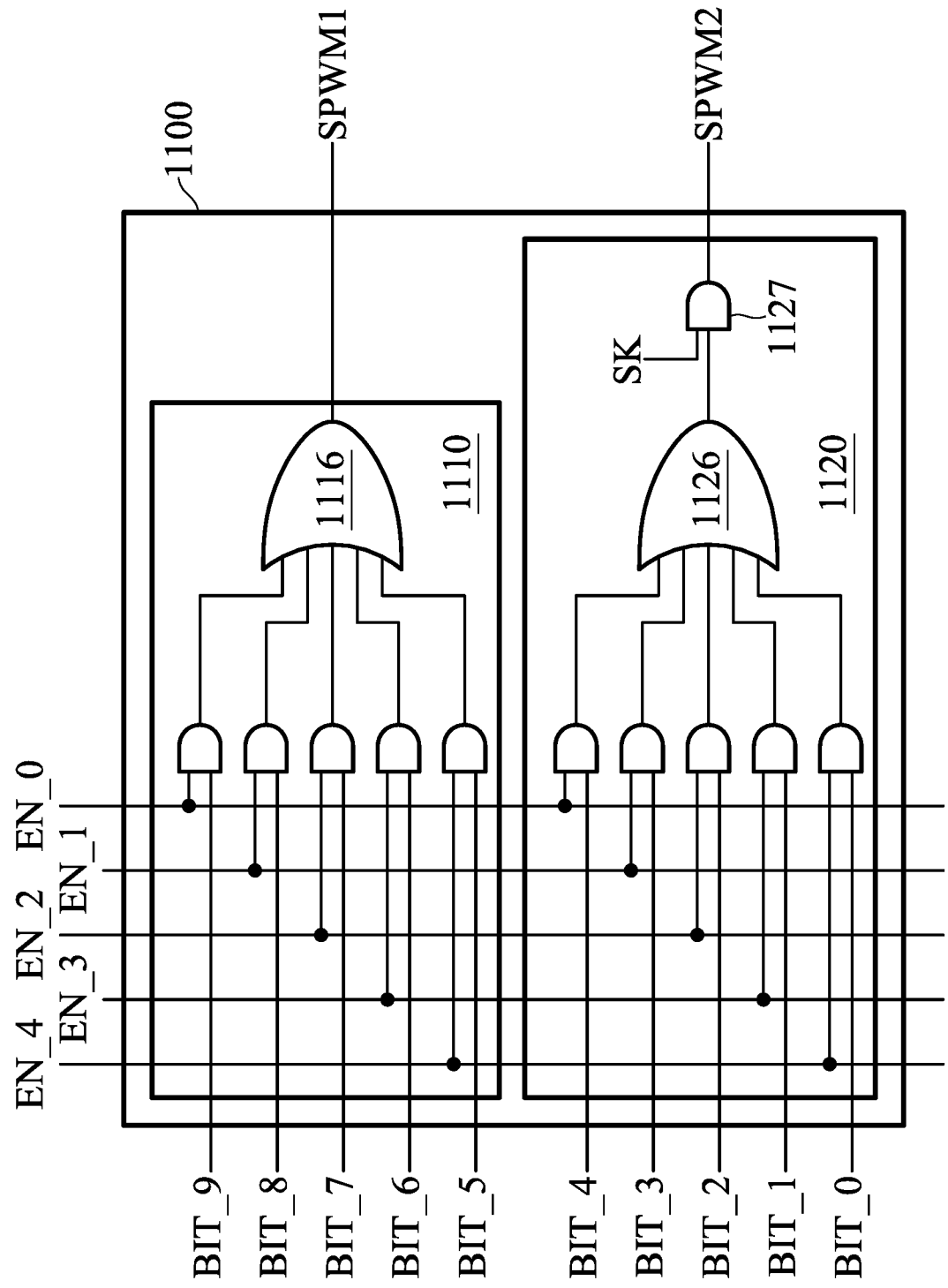
FIG. 11 is a schematic diagram of the PWM circuit 830 in FIG. 8 in accordance with another embodiment of the disclosure.

FIG. 11 is a schematic diagram of the PWM circuit 830 in FIG. 8 in accordance with another embodiment of the disclosure, in which the enable signal EN, MSB control signal SC_MSB, and the LSB control signal SC_LSB are illustrated as 5-bit. As shown in FIG. 11, the PWM circuit 1100 includes a first sub PWM circuit 1110 and a second sub PWM circuit 1120. Compared FIG. 11 to FIG. 10, the first sub PWM circuit 1110 is identical to the first sub PWM circuit 1010, and the second sub PWM circuit 1120 further includes an AND gate 1127. The AND gate 1127 performs an AND logic function on the result of the OR gate 1126 and a skip signal SK.

Figure 12:
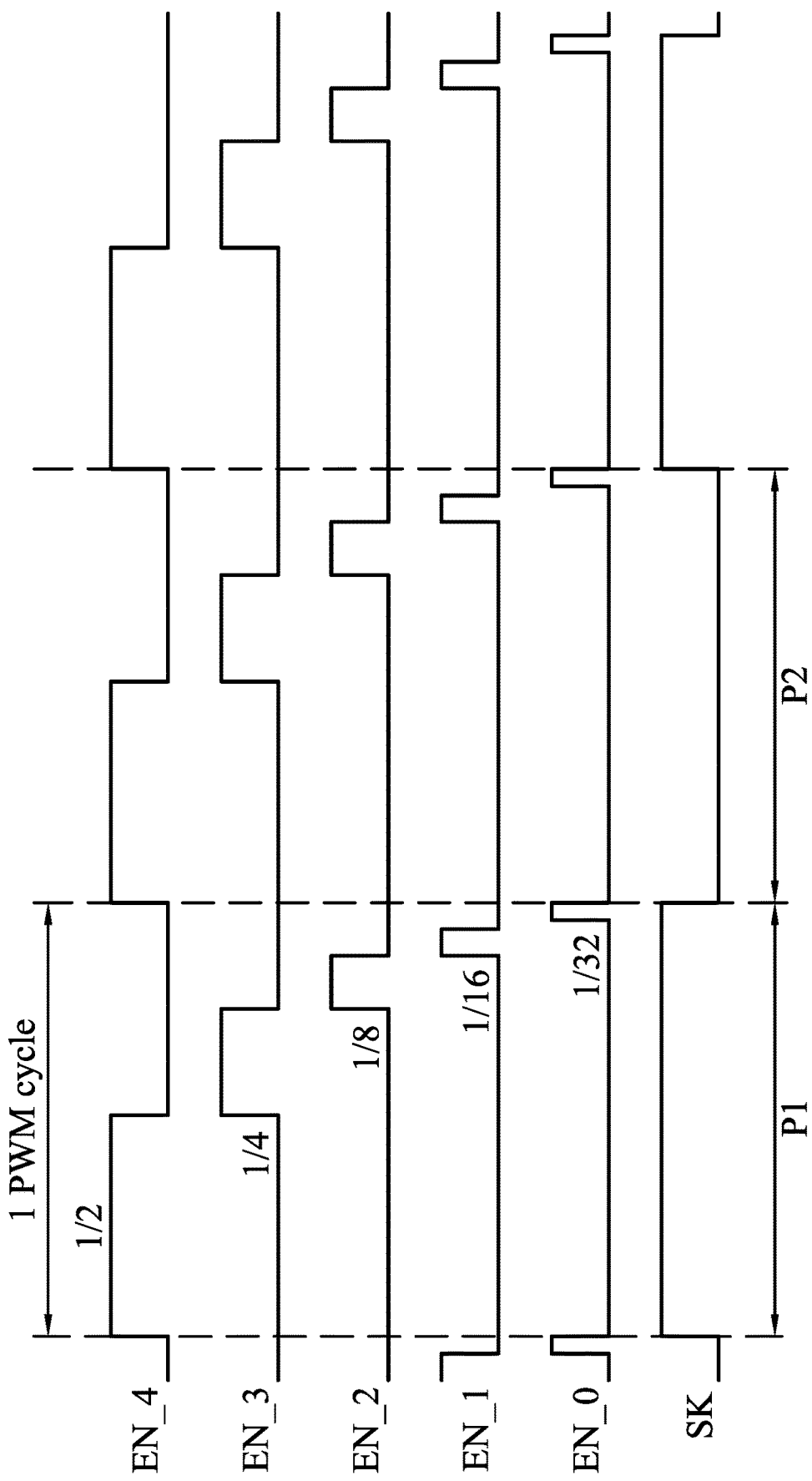
FIG. 12 illustrates a waveform of the enable signal and the skip signal in accordance with an embodiment of the disclosure.

FIG. 12 illustrates a waveform of the enable signal and the skip signal in accordance with an embodiment of the disclosure. As shown in FIG. 12, the frequency of the skip signal SK is half of the frequency of EN_4. According to an embodiment of the disclosure, the second sub PWM circuit 1120 generates the LSB PWM signal SPWM2 in the first period P1 and stops generating the LSB PWM signal SPWM2 in the second period P2 according to the skip signal SK.

In other words, the duty cycle of the LSB PWM signal SPWM2 generated by the second sub PWM circuit 1120 is half of that generated by the second sub PWM circuit 1020. Since the duty cycle of the LSB PWM signal SPWM2 can be halved by using of the skip signal SK, the second current I2 in FIG. 8 can be doubled for operating the LED away from the unstable output region 901 in FIG. 9.

According to another embodiment of the disclosure, the frequency of EN_4 is triple that of the skip signal SK so that the second current I2 is triple. According to other embodiments of the disclosure, the frequency of EN_4 is M-fold of that of the skip signal SK so that the second current I2 is M-fold, in which M is an integer.

Figure 13:
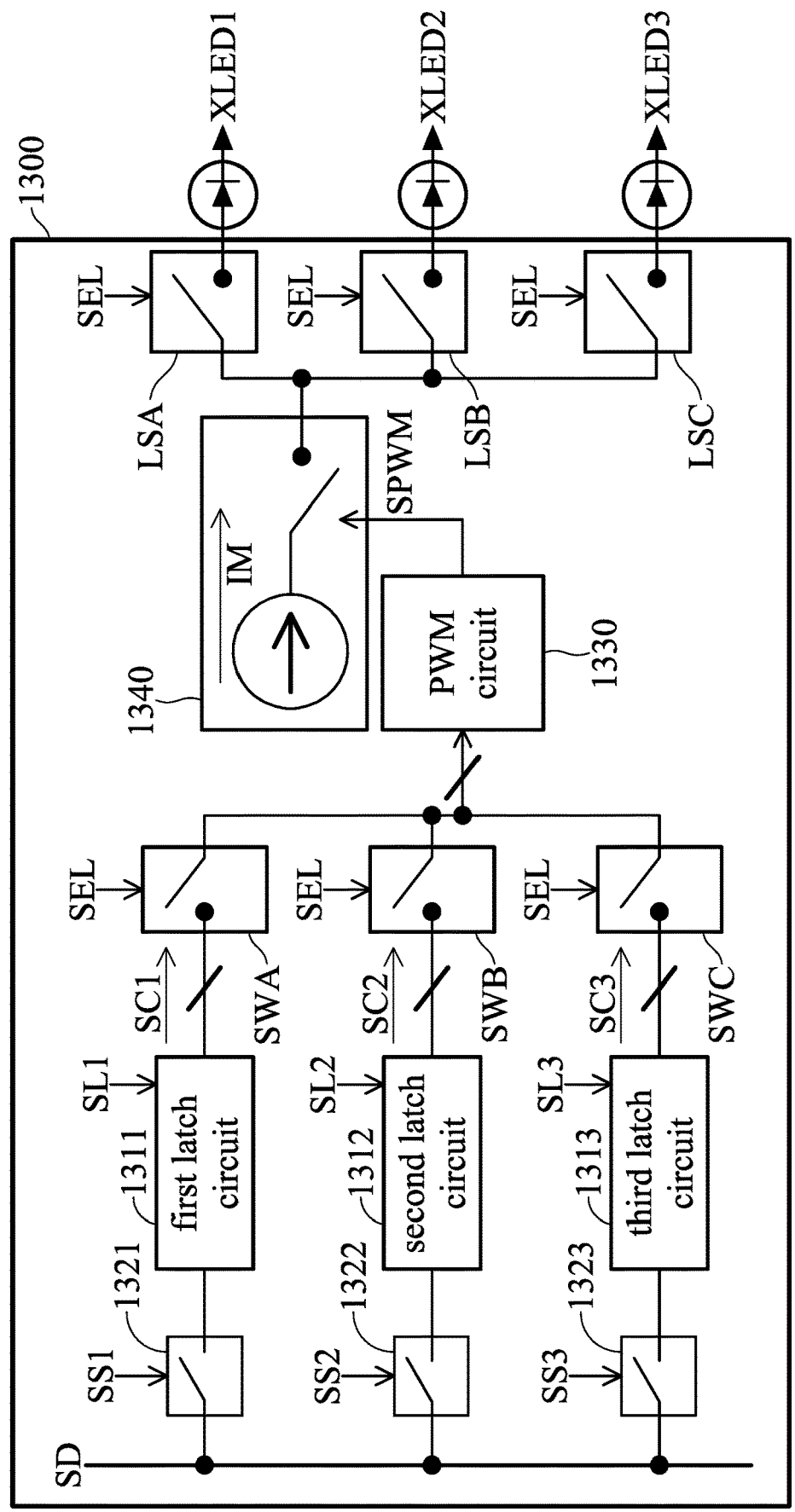
FIG. 13 is a schematic diagram of a pixel circuit in accordance with another embodiment of the disclosure.

FIG. 13 is a schematic diagram of a pixel circuit in accordance with another embodiment of the disclosure. As shown in FIG. 13, the pixel circuit 1300, which is configured to illuminate a first LED unit XLED1, a second LED unit XLED2, and a third LED unit XLED3, includes a first latch circuit 1311, a second latch circuit 1312, a third latch circuit 1313, a first pass switch 1321, a second pass switch 1322, a third pass switch 1323, a first latch-selection switch SWA, a second latch-selection switch SWB, a third latch-selection switch SWC, a PWM circuit 1330, a current source 1340, a first LED-selection switch LSA, a second LED-selection switch LSB, and a third LED-selection switch LSC.

The first latch circuit 1311 latches first control data from the data signal SD according to a first latch signal SL1 to generate a first control signal SC1. The second latch circuit 1312 latches second control data from the data signal SD according to a second latch signal SL2 to generate a second control signal SC2. The third latch circuit 1313 latches third control data from the data signal SD according to a third latch signal SL3 to generate a third control signal SC3.

The data signal SD sequentially provides the first control data, the second control data, and the third control data. The first pass switch 1321 provides the first control data from the data signal SD to the first latch circuit 1311 according to a first scan signal SS1. The second pass switch 1322 provides the second control data from the data signal SD to the second latch circuit 1312 according to a second scan signal SS2. The third pass switch 1323 provides the third control data from the data signal SD to the third latch circuit 1313 according to a third scan signal SS3.

The first latch-selection switch SWA, the second latch-selection switch SWB, and the third latch-selection switch SWC are configured to provide the first control signal SC1, the second control signal SC2, and the third control signal SC3 to the PWM circuit 1330 according to a selection signal SEL. The PWM circuit 1330 generates the PWM signal SPWM.

The current source 1340 generates a constant current IM and supplies the constant current IM to one of the first LED unit XLED1, the second LED unit XLED2, and the third LED unit XLED3 according to the PWM signal SPWM. The first LED-selection switch LSA, the second LED-selection switch LSB, and the third LED-selection switch LSC provide the constant current IM to one of the first LED unit XLED1, the second LED unit XLED2, and the third LED unit XLED3 according to the selection signal SEL.

According to an embodiment of the disclosure, the first LED unit XLED1, the second LED unit XLED2, and the third LED unit XLED3 share the data signal SD, the PWM circuit 1330, and the current source 1340 so that the area occupied by the pixel circuit 1300 can be reduced. According to other embodiments of the disclosure, the data signal SD, the PWM circuit 1330, and the current source 1340 could be shared by any number of LED units, which is not intended to be limited thereto.

Figure 14:
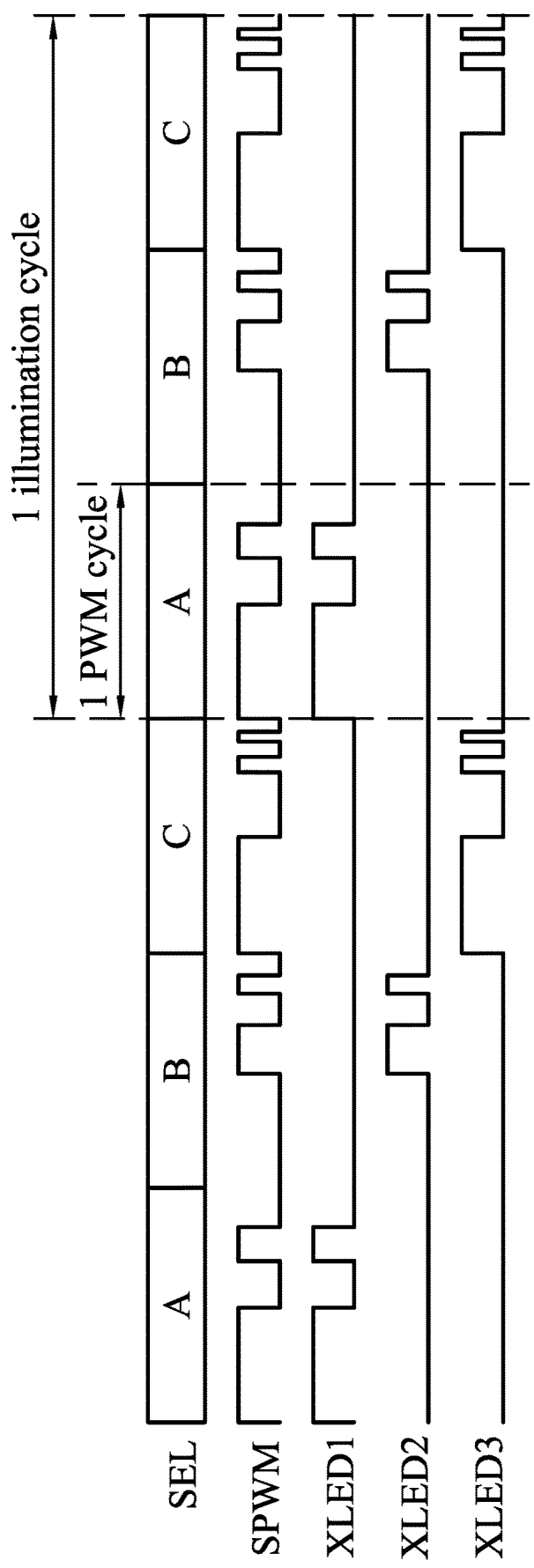
FIG. 14 illustrates the waveforms of the selection signal in accordance with an embodiment of the disclosure.

FIG. 14 illustrates the waveforms of the selection signal in accordance with an embodiment of the disclosure. As shown in FIG. 14, when the selection signal SEL is in the state A, the first latch-selection switch SWA and the first LED-selection switch LSA are ON according to the selection signal SEL so that the first LED unit XLED1 is illuminated. Therefore, when the selection signal SEL is in the state B and the state C, the second LED unit XLED2 and the third LED unit XLED3 are illuminated accordingly.

As shown in FIG. 14, one PWM cycle indicates that either one of the first LED unit XLED1, the second LED unit XLED2, and the third LED unit XLED3 is illuminated, and one illumination cycle indicates that the first LED unit XLED1, the second LED unit XLED2, and the third LED unit XLED3 are sequentially illuminated.

According to an embodiment of the disclosure, since the duty cycle of illuminating each of the first LED unit XLED1, the second LED unit XLED2, and the third LED unit XLED3 has become to be one-third, the constant current IM preferably, but is not limited to, be 3 times the constant current IC in FIG. 1 to keep the same brightness.

Figure 15:
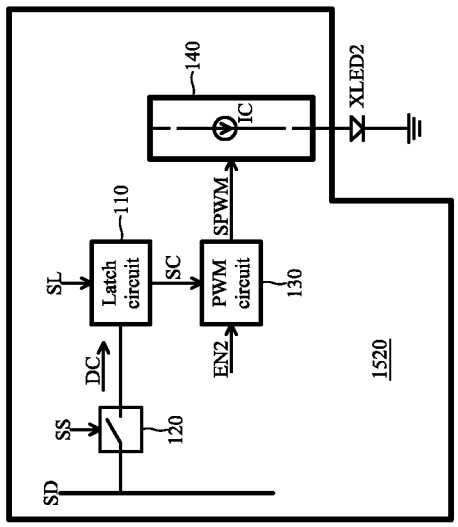
FIG. 15 is a block diagram of a driving circuit in accordance with an embodiment of the disclosure.
Figure 15:
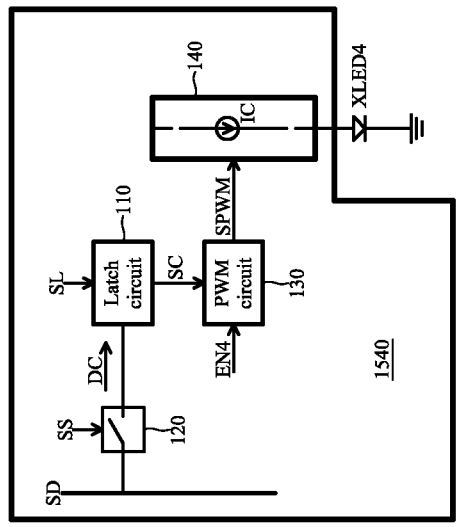
Figure 15:
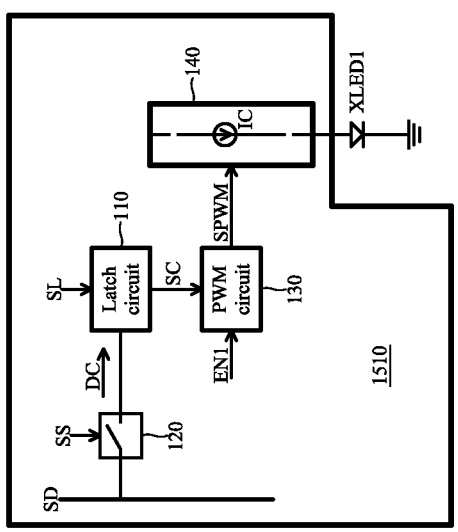
Figure 15:
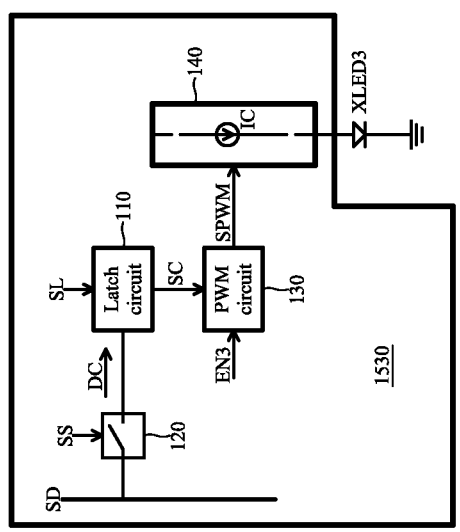

FIG. 15 is a block diagram of a driving circuit in accordance with an embodiment of the disclosure. As shown in FIG. 15, the driving circuit 1500 includes a first pixel circuit 1510, a second pixel circuit 1520, a third pixel circuit 1530, and a fourth pixel circuit 1540.

The first pixel circuit 1510 is configured to illuminate the first LED unit XLED1, the second pixel circuit 1520 is configured to illuminate the second LED unit XLED2, the third pixel circuit 1530 is configured to illuminate the third LED unit XLED3, and the fourth pixel circuit 1540 is configured to illuminate the fourth LED unit XLED4. As shown in FIG. 15, the first pixel circuit 1510, the second pixel circuit 1520, the third pixel circuit 1530, and the fourth pixel circuit 1540 are respectively activated by a first enable signal EN1, a second enable signal EN2, a third enable signal EN3, and a fourth enable signal EN4.

According to an embodiment of the disclosure, each of the first pixel circuit 1510, the second pixel circuit 1520, the third pixel circuit 1530, and the fourth pixel circuit 1540 corresponds to the pixel circuit 100 in FIG. 1 or the pixel circuit 800 in FIG. 8. As shown in FIG. 15, the first LED unit XLED1, the second LED unit XLED2, the third LED unit XLED3, and the fourth LED unit XLED4 are arranged in a matrix.

Namely, the first LED unit XLED1 and the second LED unit XLED2 are arranged in one row, and the third LED unit XLED3 and the fourth LED unit XLED4 are arranged in another row. In addition, the first LED unit XLED1 and the third LED unit XLED3 are arranged in one column, and the second LED unit XLED2 and the fourth LED unit XLED4 are arranged in another column.

In order to eliminate flicker, the enable signals of two of the first pixel circuit 1510, the second pixel circuit 1520, the third pixel circuit 1530, and the fourth pixel circuit 1540 are out-of-phase with the other two.

Figure 16:
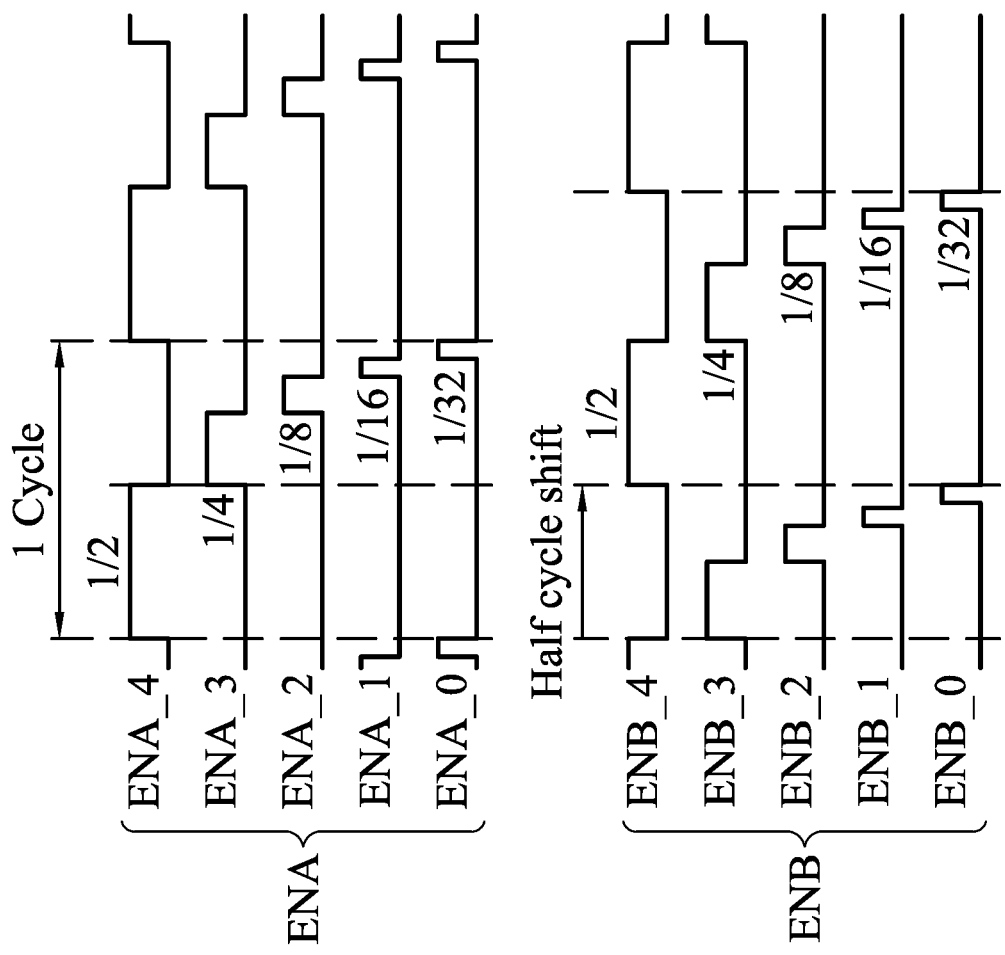
FIG. 16 shows two enable signals in accordance with an embodiment of the disclosure.

FIG. 16 shows two enable signals in accordance with an embodiment of the disclosure. As shown in FIG. 16, the type-A enable signal ENA and the type-B enable signal ENB are illustrated as 5-bit, but it is not intended to be limited thereto. In addition, the type-B enable signal ENB is delayed from the type-A enable signal ENA by a half of cycle.

For flicker elimination, two of the first pixel circuit 1510, the second pixel circuit 1520, the third pixel circuit 1530, and the fourth pixel circuit 1540 in FIG. 15 are applied by the type-A enable signal ENA, and the other two are applied by the type-B enable signal ENB.

According to an embodiment of the disclosure, the first enable signal EN1 and the second enable signal EN2 are applied by the type-A enable signal ENA, and the third enable signal EN3 and the fourth enable signal EN4 are applied by the type-B enable signal ENB.

According to another embodiment of the disclosure, the first enable signal EN1 and the third enable signal EN3 are applied by the type-A enable signal ENA, and the second enable signal EN2 and the fourth enable signal EN4 are applied by the type-B enable signal ENB.

According to yet another embodiment of the disclosure, the first enable signal EN1 and the fourth enable signal EN4 are applied by the type-A enable signal ENA, and the second enable signal EN2 and the third enable signal EN3 are applied by the type-B enable signal ENB.

According to other embodiments of the disclosure, 3 or more enable signals with shifted phases and any other spatial arrangement can be adopted, but they are not intended to be limited thereto.

Figure 17:
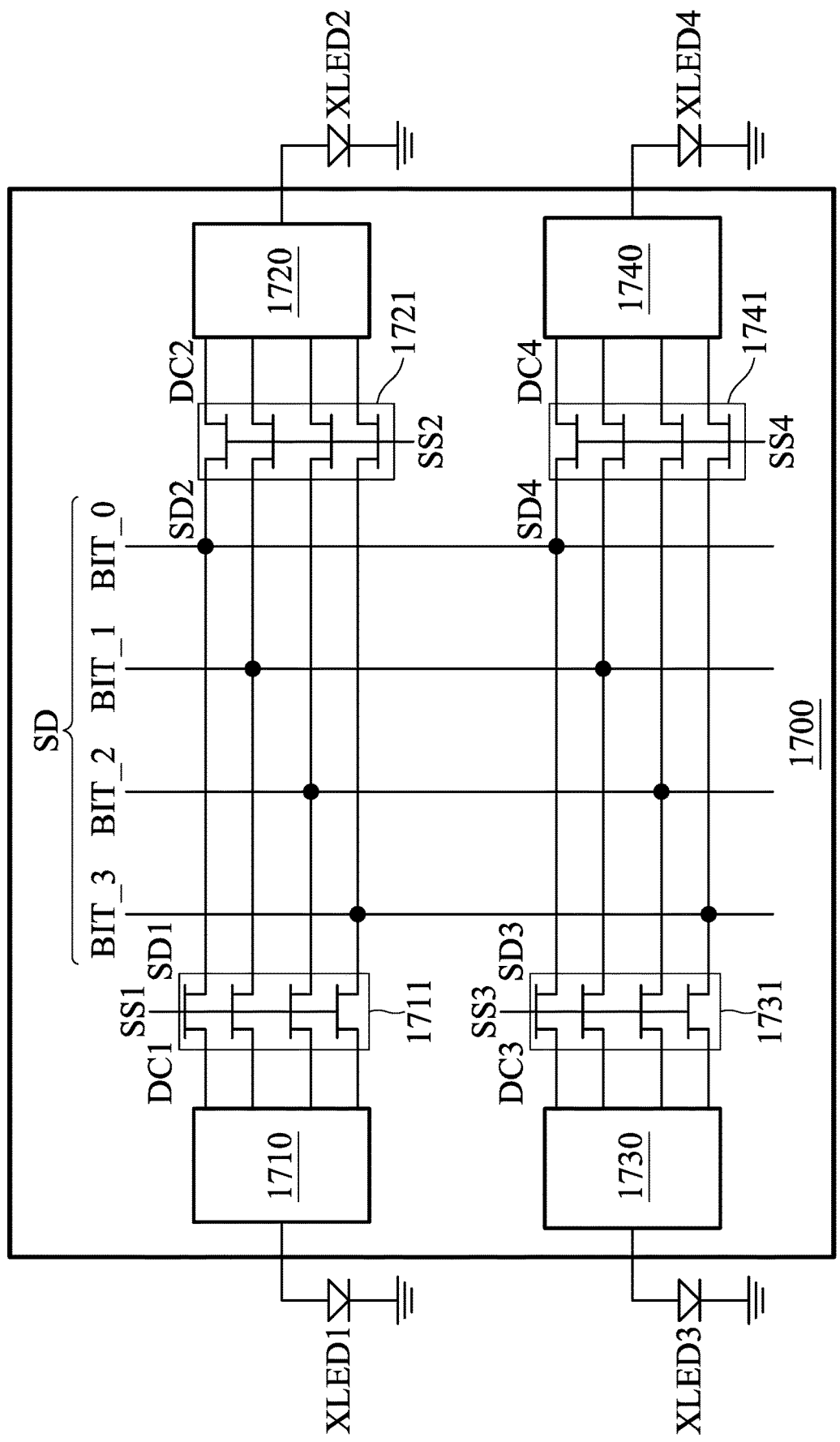
FIG. 17 is a block diagram of a driving circuit in accordance with another embodiment of the disclosure.

FIG. 17 is a block diagram of a driving circuit in accordance with another embodiment of the disclosure. As shown in FIG. 17, the driving circuit 1700 includes a first pixel circuit 1710, a second pixel circuit 1720, a third pixel circuit 1730, and a fourth pixel circuit 1740.

The first pixel circuit 1710 is configured to illuminate the first LED unit XLED1, the second pixel circuit 1720 is configured to illuminate the second LED unit XLED2, the third pixel circuit 1730 is configured to illuminate the third LED unit XLED3, and the fourth pixel circuit 1740 is configured to illuminate the fourth LED unit XLED4.

According to an embodiment of the disclosure, each of the first pixel circuit 1710, the second pixel circuit 1720, the third pixel circuit 1730, and the fourth pixel circuit 1740 corresponds to the pixel circuit 100 in FIG. 1 or the pixel circuit 800 in FIG. 8. As shown in FIG. 17, the first LED unit XLED1, the second LED unit XLED2, the third LED unit XLED3, and the fourth LED unit XLED4 are arranged in a matrix. Namely, the first LED unit XLED1 and the second LED unit XLED2 are in one row, and the third LED unit XLED3 and the fourth LED unit XLED4 are in another row.

In order to reduce the amount of area occupied by the data lines for each of the first pixel circuit 1710, the second pixel circuit 1720, the third pixel circuit 1730, and the fourth pixel circuit 1740, the first pixel circuit 1710, the second pixel circuit 1720, the third pixel circuit 1730, and the fourth pixel circuit 1740 share the same data lines. As shown in FIG. 17, the data signal SD provided by the data lines is illustrated as 4-bit, which includes BIT_0, BIT_1, BIT_2, and BIT_3, but it is not intended to be limited thereto.

Figure 18:
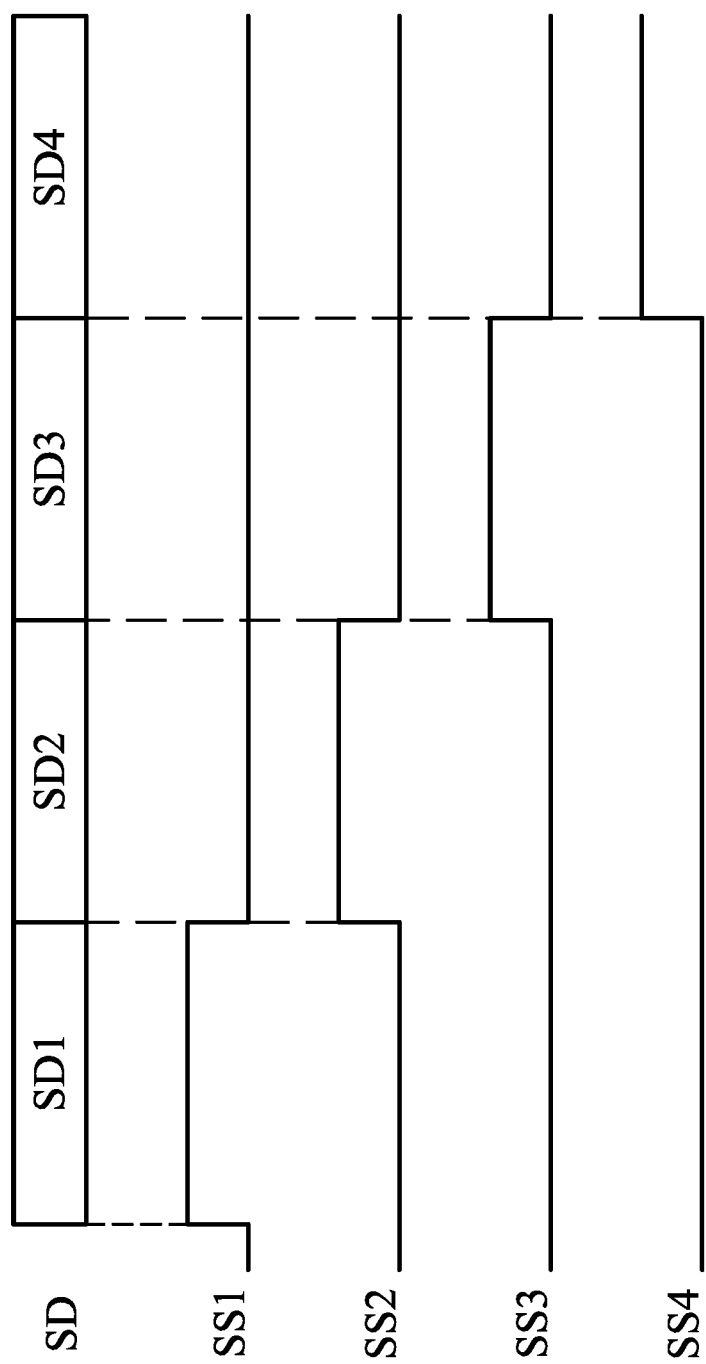
FIG. 18 illustrates the waveforms of the data signal and the scan signals in FIG. 17 in accordance with an embodiment of the disclosure.

FIG. 18 illustrates the waveforms of the data signal and the scan signals in FIG. 17 in accordance with an embodiment of the disclosure. As shown in FIG. 18, the data lines in FIG. 17 sequentially provides the first data signal SD1, the second data signal SD2, the third data signal SD3 and the fourth data signal SD4.

The first scan signal SS1, the second scan signal SS2, the third scan signal SS3, and the fourth scan signal SS4 sequentially activate the first pass switch 1711, the second pass switch 1721, the third pass switch 1731, and the fourth pass switch 1741 so that the first pixel circuit 1710, the second pixel circuit 1720, the third pixel circuit 1730, and the fourth pixel circuit 1740 sequentially and respectively receive the first control data DC1, the second control data DC2, the third control data DC3, and the fourth control data DC4.

According to an embodiment of the disclosure, when gray scale resolution is higher, more bits of data signal are required. In order to reduce the area occupied by the data signals, one data signal shared by neighboring pixel circuits as shown in FIG. 17 may greatly reduce the overall number of the data signals. The area occupied by the data signals is therefore reduced.

Figure 19:
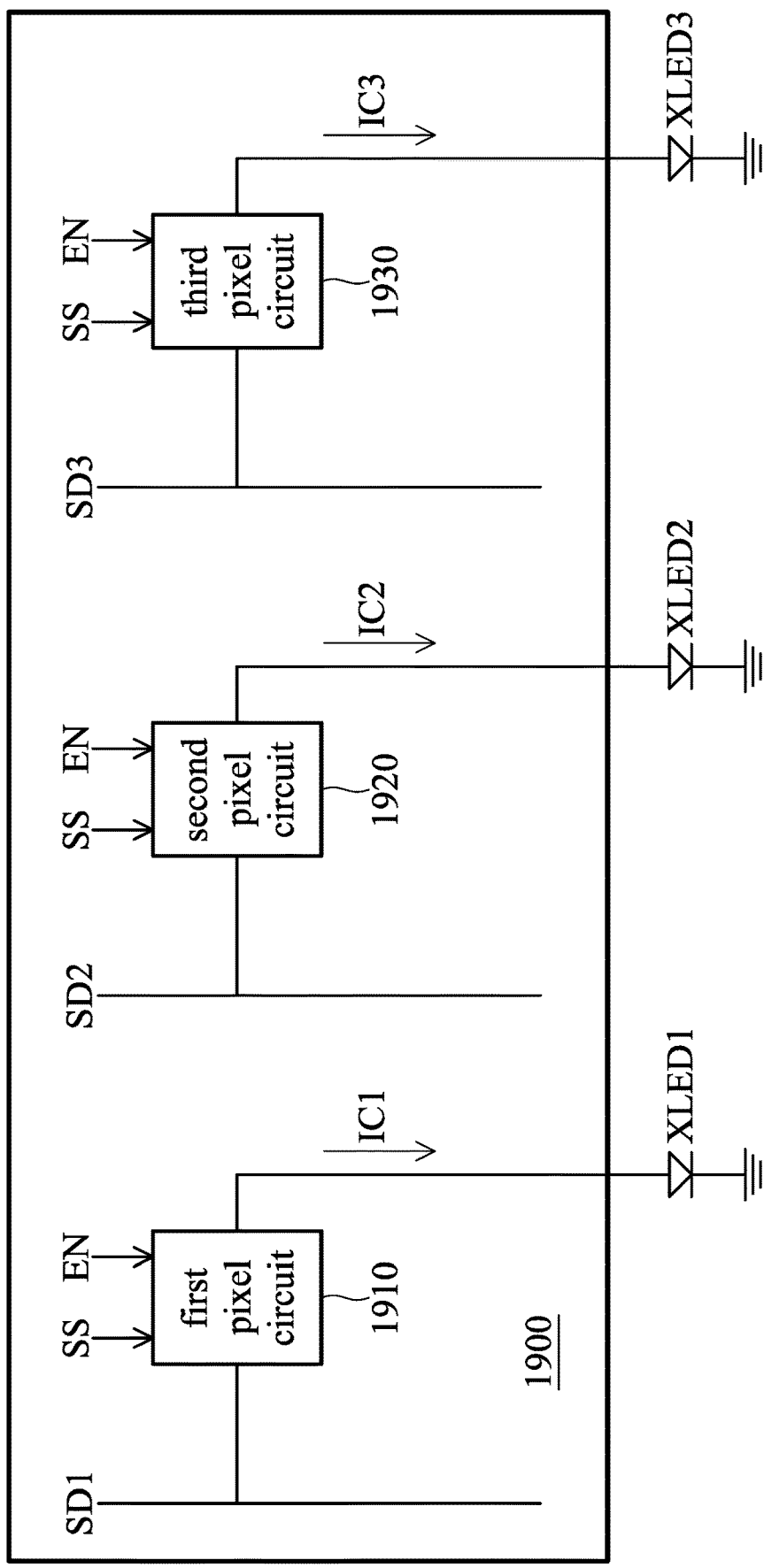
FIG. 19 is a block diagram of a driving circuit in accordance with another embodiment of the disclosure.

FIG. 19 is a block diagram of a driving circuit in accordance with another embodiment of the disclosure. As shown in FIG. 19, the driving circuit 1900, which is configured to illustrate a first LED unit XLED1, a second LED unit XLED2, and a third LED unit XLED3, includes a first pixel circuit 1910, a second pixel circuit 1920, and a third pixel circuit 1930.

According to an embodiment of the disclosure, the first LED unit XLED1 generates a first color, the second LED unit XLED2 generates a second color, and the third LED unit XLED3 generates a third color, in which the first color, the second color, and the third color are different from one another. According to another embodiment of the disclosure, the first color is red, the second color is green, and the third color is blue. According to other embodiments of the disclosure, the second color, and the third color can be any color but different from one another.

According to an embodiment of the disclosure, the first pixel circuit 1910, the second pixel circuit 1920, and the third pixel circuit 1930 correspond to the pixel circuit 100 in FIG. 1. According to another embodiment of the disclosure, the first pixel circuit 1910, the second pixel circuit 1920, and the third pixel circuit 1930 correspond to the pixel circuit 800 in FIG. 8.

As shown in FIG. 19, the first pixel circuit 1910 receives the first data signal SD1 and then generates a first constant current IC1 according to the enable signal EN and the scan signal SS. The first constant current IC1 flows through the first LED unit XLED1 so that the first LED unit XLED1 generates the first color with a first brightness.

The second pixel circuit 1920 receives the second data signal SD2 and then generates a second constant current IC2 according to the enable signal EN and the scan signal SS. The second constant current IC2 flows through the second LED unit XLED2 so that the second LED unit XLED2 generates the second color with a second brightness.

The third pixel circuit 1930 receives the third data signal SD3 and then generates a third constant current IC3 according to the enable signal EN and the scan signal SS. The third constant current IC3 flows through the third LED unit XLED3 so that the third LED unit XLED3 generates the third color with a third brightness.

According to an embodiment of the disclosure, each of the first constant current IC1, the second constant current IC2, and the third constant current IC3 is generated by the current source 140 in FIG. 1. According to another embodiment of the disclosure, each of the first constant current IC1, the second constant current IC2, and the third constant current IC3 is generated by the current source 840 in FIG. 8.

According to an embodiment of the disclosure, the primary color output level (i.e., white balance) illuminated by the first LED unit XLED1, the second LED unit XLED2, and the third LED unit XLED3 can be adjusted by individually setting the first constant current IC1, the second constant current IC2, and the third constant current IC3. In other words, the first constant current IC1, the second constant current IC2, and the third constant current IC3 could be different and independent from one another.

According to an embodiment of the disclosure, the driving circuit 1900 is implemented by a CMOS process to reduce the area occupied by the driving circuit 1900.

Figure 20:
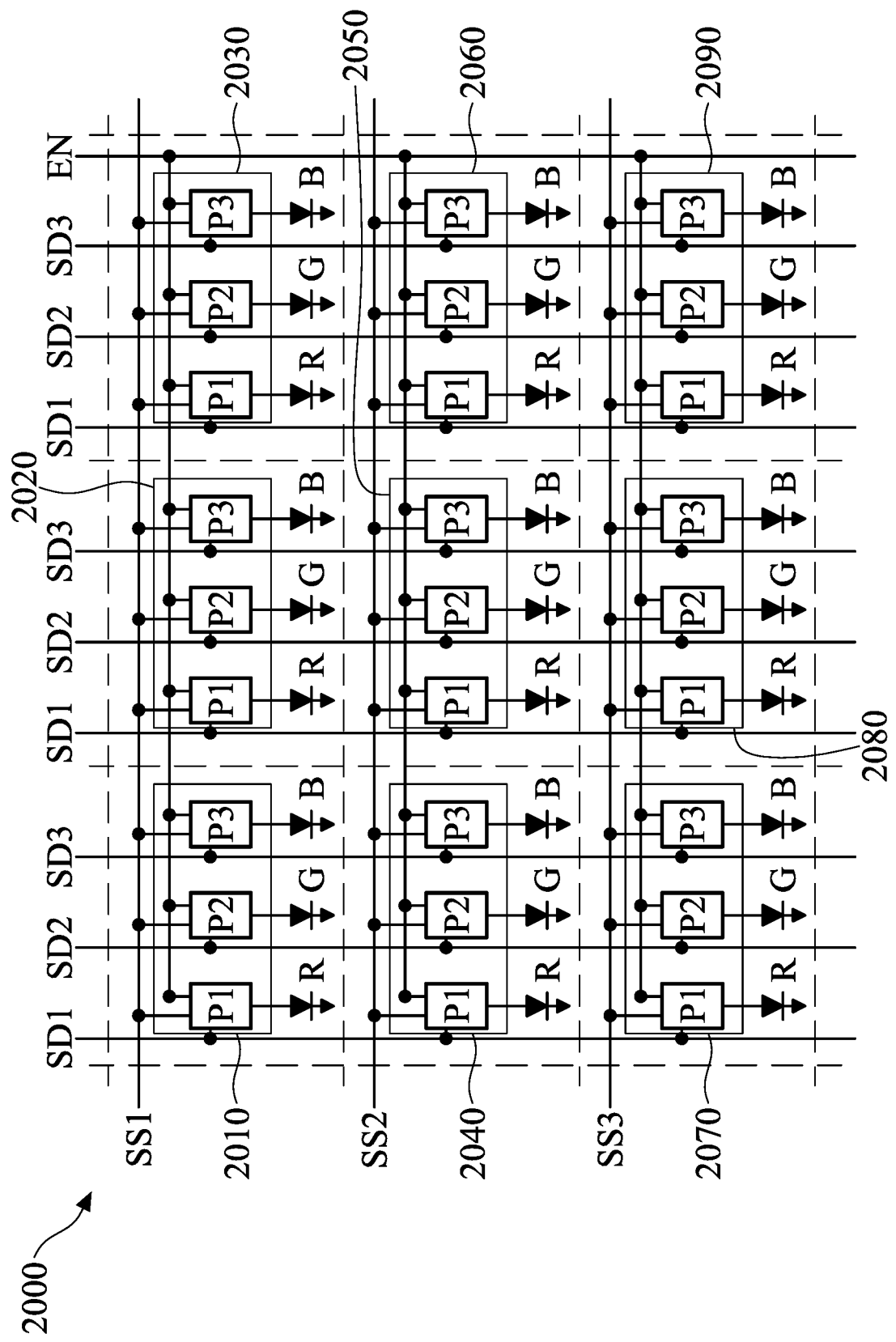
FIG. 20 illustrates a layout of driving circuits in accordance with an embodiment of the disclosure.

FIG. 20 illustrates a layout of driving circuits in accordance with an embodiment of the disclosure. As shown in FIG. 20, the layout 2000 includes a plurality of driving circuits 2010-2090, in which each of the driving circuit 2010-2090 includes a first pixel circuit P1 driving a red LED unit R, a second pixel circuit P2 driving a green LED unit G, and a third pixel circuit P3 driving a blue LED unit B.

According to an embodiment of the disclosure, the first pixel circuit P1 corresponds to the first pixel circuit 1910, the second pixel circuit P2 corresponds to the second pixel circuit 1920, and the third pixel circuit P3 corresponds to the third pixel circuit 1930. As shown in FIG. 20, each of the first pixel circuit P1, the second pixel circuit P2, and the third pixel circuit P3 in the driving circuits 2010-2090 receives a corresponding data signal (i.e., SD1, SD2, or SD3), a corresponding scan signal (i.e., SS1, SS2, or SS3), and the enable signal EN.

According to an embodiment of the disclosure, all the pixel circuits P1, P2, and P3 are individually packaged as an integrated circuit. According to an embodiment of the disclosure, each of the first pixel circuit P1, the second pixel circuit P2, and the third pixel circuit P3 is implemented by a CMOS process to reduce the overall area of the layout 2000.

Figure 21:
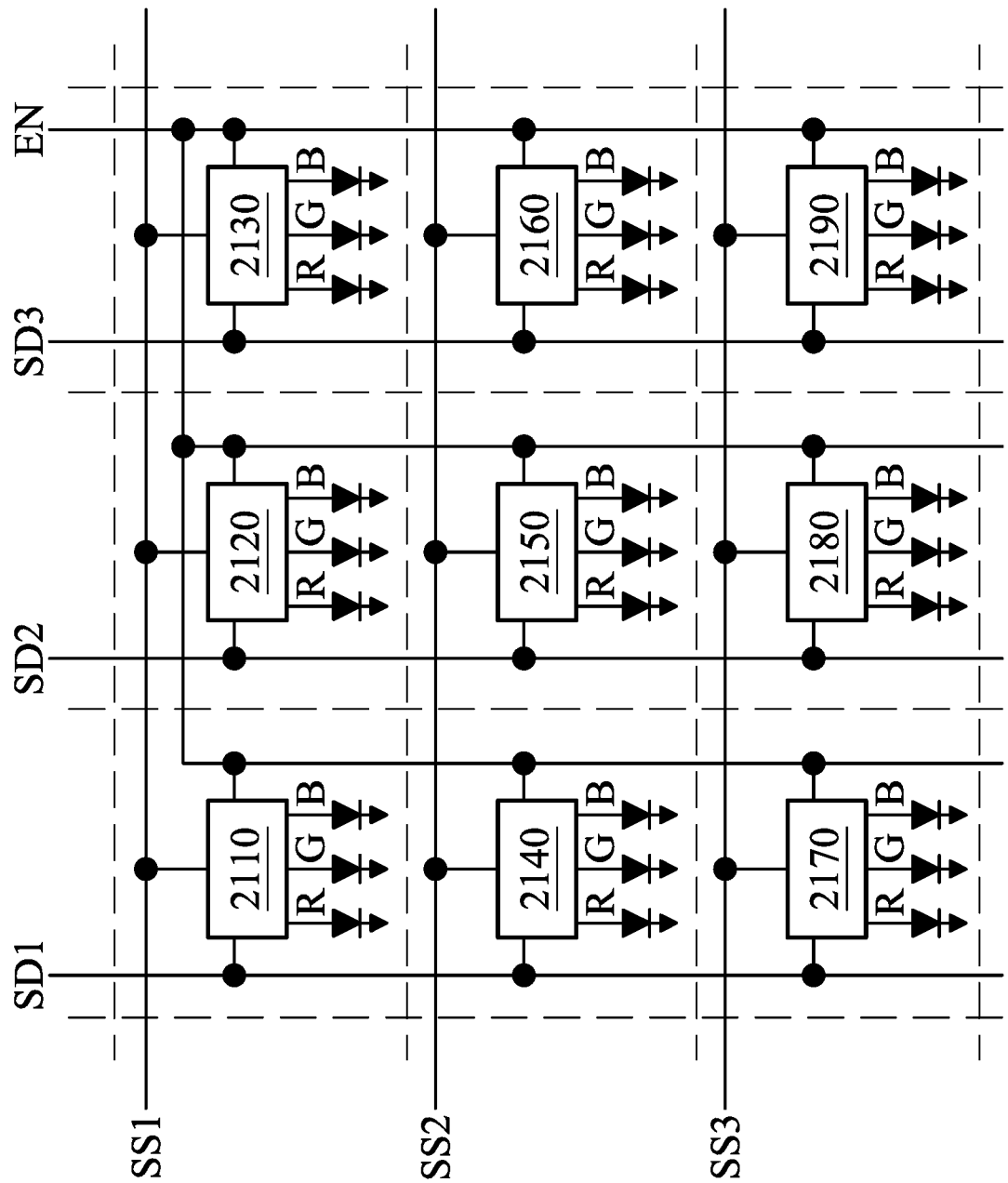
FIG. 21 illustrates a layout of driving circuits in accordance with another embodiment of the disclosure.

FIG. 21 illustrates a layout of driving circuits in accordance with another embodiment of the disclosure. As shown in FIG. 21, the layout 2100 includes a plurality of driving circuits 2110-2190. According to an embodiment of the disclosure, each of the driving circuits 2110-2190 corresponds to the driving circuit 1900 in FIG. 19. According to another embodiment of the disclosure, the driving circuits 2110-2190 correspond to the driving circuits 2010-2090 respectively.

As shown in FIG. 21, each of the driving circuits 2110-2190 drives a red LED unit R, a green LED unit G, and a blue LED unit B according to the data signal SD, a corresponding scan signal (i.e., SS1, SS2, or SS3), and the enable signal EN. According to an embodiment of the disclosure, the data signal SD in FIG. 21 includes the first data signal SD1, the second data signal SD2, and the third data signal SD3.

According to an embodiment of the disclosure, each of the driving circuits 2110-2190 is individually packaged as an integrated circuit. According to an embodiment of the disclosure, each of the driving circuits 2110-2190 is implemented by a CMOS process to reduce the area occupied by the driving circuits 2110-2190.

Figure 22:
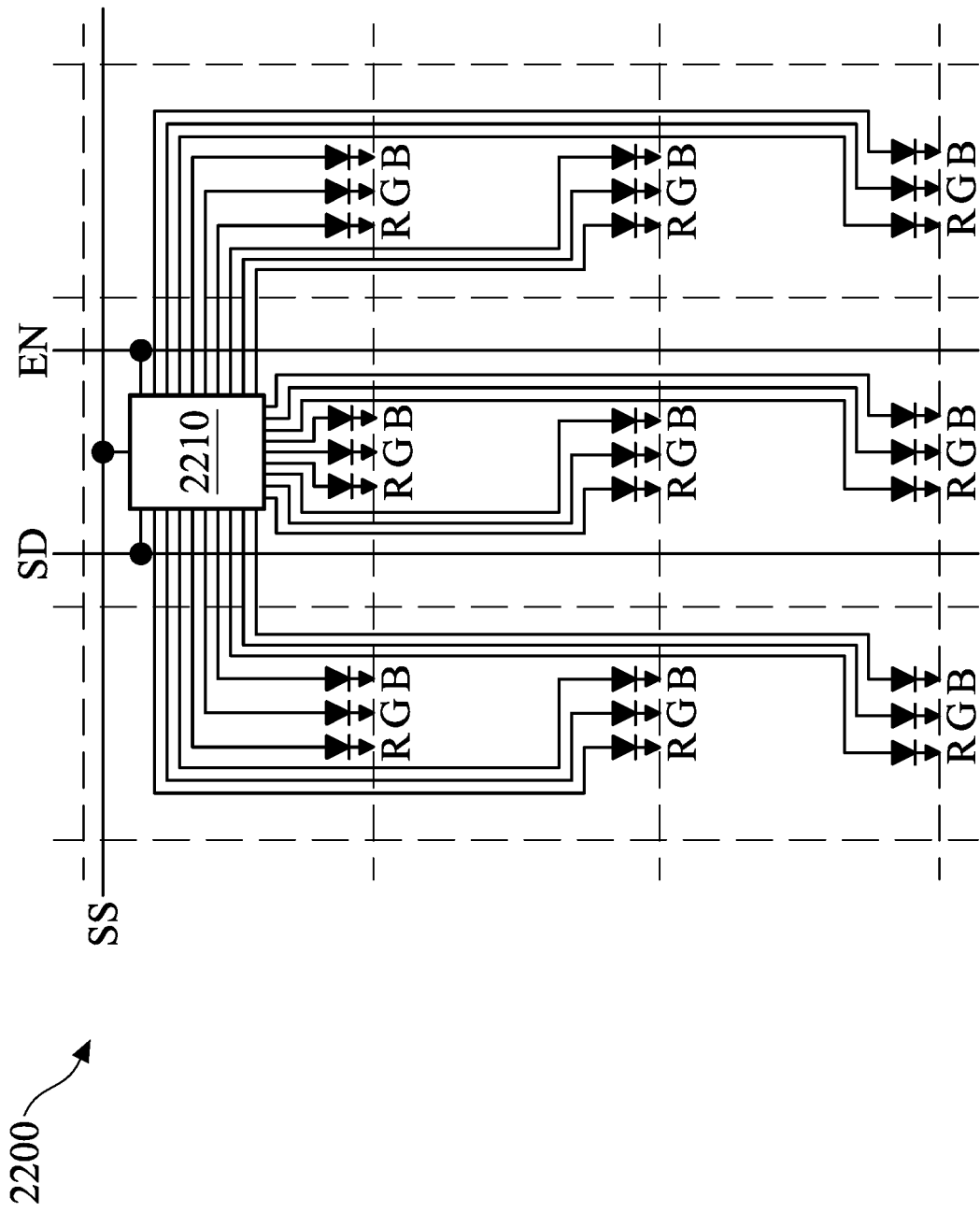
FIG. 22 illustrates a layout of driving circuits in accordance with yet another embodiment of the disclosure.

FIG. 22 illustrates a layout of driving circuits in accordance with yet another embodiment of the disclosure. Compared the layout 2200 in FIG. 22 to the layout 2100 in FIG. 21, the driver 2210, which is configured to drive each set of the red LED unit R, the green LED unit G, and the blue LED unit B, includes all of the driving circuits 2110-2190 in FIG. 21.

In other words, all the driving circuits 2110-2190 are packaged together as the driver 2210, such as an integrated circuit. According to an embodiment of the disclosure, the driver 2210 is implemented by a CMOS process to reduce the area occupied by the driver 2210.

LED driving circuits using the PWM dimming method are provided herein so that the issues of the analog dimming method can be eliminated. Or, the performance of driving LEDs can be improved compared to that of the analog dimming method.

While the disclosure has been described by way of example and in terms of preferred embodiment, it should be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A pixel circuit for illuminating a first LED unit with a level of brightness, comprising:

a first latch circuit, latching first control data according to a first latch signal to generate a first control signal;

a first pass switch, providing the first control data from a data signal to the first latch circuit according to a scan signal;

a PWM circuit, generating a PWM signal according to the first control signal and an enable signal; and a current source, supplying a constant current flowing through the first LED unit according to the PWM signal;

wherein the first control data is divided into an MSB (Most Significant Bit) control data and an LSB (Least Significant Bit) control data;

wherein the first latch circuit comprises;

a first sub latch circuit, latching the MSB control data according to the first latch signal to generate an MSB control signal; and a second sub latch circuit, latching the LSB control data according to the first latch signal to generate an LSB control signal;

wherein the first pass switch comprises:

a first sub switch, providing the MSB control data from the data signal to the first sub latch circuit according to the scan signal; and a second sub switch, providing the LSB control data from the data signal to the second sub latch circuit according to the scan signal;

wherein the PWM (Pulse Width Modulation) circuit comprises:

a first sub PWM circuit, generating an MSB PWM signal according to the MSB control signal and the enable signal; and a second sub PWM circuit, generating an LSB PWM signal according to the LSB control signal and the enable signal;

wherein the current source comprises:

a first sub current source, supplying a first current to the first LED unit according to the MSB PWM signal; and a second sub current source, supplying a second current to the first LED unit according to the LSB PWM signal, wherein the second current is lower than the first current.

2. The pixel circuit of claim 1, wherein the first control data, the first control signal, and the enable signal are N bits, wherein N is a positive integer, wherein the PWM signal is a result of an AND logic function of the first control signal and the enable signal.

3. The pixel circuit of claim 2, wherein the PWM circuit comprises:

a plurality of AND gates, wherein each of the AND gates performs the AND logic function on each bit of the first control signal and a corresponding bit of the enable signal to generate an output signal; and an OR gate, performing an OR operation on the output signals of the AND gates to generate the PWM signal.

4. The pixel circuit of claim 2, wherein the PWM circuit comprises:

a plurality of transmission transistors, wherein each of the plurality of transmission transistors provides a corresponding bit of the first control signal according to a corresponding bit of the enable signal.

5. The pixel circuit of claim 1, wherein the level of brightness of the first LED unit is dimmed by a duty cycle of the PWM signal.

6. The pixel circuit of claim 1, wherein the current source comprises:

a transistor comprising a source terminal, a gate terminal, and a drain terminal, wherein the source terminal is supplied by a supply voltage and the drain terminal is coupled to the first LED unit; and a dimming switch, providing a first bias voltage or a second bias voltage to the gate terminal of the transistor according to the PWM signal, wherein the transistor generates the constant current according to the first bias voltage.

7. The pixel circuit of claim 1, wherein the current source comprises:

a transistor, generating the constant current according to a bias voltage, wherein the transistor comprises a source terminal, a gate terminal, and a drain terminal, wherein the source terminal is supplied by a supply voltage and the gate terminal receives the bias voltage; and a dimming switch, coupling the drain terminal of the transistor to the first LED unit according to the PWM signal.

8. The pixel circuit of claim 7, wherein the current source further comprises:

a capacitor, coupled between the gate terminal and the source terminal of the transistor; and a compensation switch, providing the bias voltage to the gate terminal of the transistor according to a compensation signal, wherein the constant current is generated in response to the bias voltage.

9. The pixel circuit of claim 1, wherein the MSB PWM signal is a logic function of the MSB control signal and the enable signal and the LSB PWM signal is a logic function of the LSB control signal and the enable signal.

10. The pixel circuit of claim 1, wherein a pre-result is a logic function of the LSB control signal and the enable signal, and the LSB PWM signal is an AND logic function of the pre-result and a skip signal, wherein a frequency of the enable signal is M times the skip signal so that a duty cycle of the LSB PWM signal is divided by M and the second current is M-fold.

11. The pixel circuit of claim 1, further comprising:

a second latch circuit, latching second control data according to a second latch signal to generate a second control signal, wherein the data signal sequentially provides the first control data and the second control data;

a second pass switch, providing the second control data from the data signal to the second latch circuit according to a second scan signal;

a first latch-selection switch, providing the first control signal to the PWM circuit according to a selection signal;

a second latch-selection switch, providing the second control signal to the PWM circuit according to the selection signal;

a first LED-selection switch, providing the constant current flowing through the first LED unit according to the selection signal; and a second LED-selection switch, providing the constant current flowing through a second LED unit according to the selection signal.

12. The pixel circuit of claim 11, wherein the selection signal is configured to illuminate the first LED unit and the second LED unit with an illumination cycle, wherein the constant current is increased according to the illumination cycle to keep the level of brightness identical.

13. A driving circuit for illuminating a first LED unit with a first color and a second LED unit with a second color, wherein the first color and the second color are different from each other, comprising:

a first pixel circuit, comprising:

a first latch circuit, latching first control data according to a first latch signal to generate a first control signal;

a first pass switch, providing the first control data from a first data signal to the first latch circuit according to a first scan signal;

a first PWM circuit, generating a first PWM signal according to the first control signal and a first enable signal; and a first current source, supplying a first constant current flowing through the first LED unit according to the first PWM signal;

a second pixel circuit, comprising:

a second latch circuit, latching second control data according to a second latch signal to generate a second control signal;

a second pass switch, providing the second control data from a second data signal to the second latch circuit according to a second scan signal;

a second PWM circuit, generating a second PWM signal according to the second control signal and a second enable signal; and a second current source, supplying a second constant current flowing through the second LED unit according to the second PWM signal.

14. The driving circuit of claim 13, wherein the first pixel circuit and the second pixel circuit are implemented by a CMOS process and individually packaged as an integrated circuit.

15. The driving circuit of claim 13, wherein the first pixel circuit and the second pixel circuit are implemented by a CMOS process and packaged together as an integrated circuit.

16. The driving circuit of claim 13, wherein the first constant current is different from the second constant current.

17. The driving circuit of claim 13, wherein the first LED unit is adjacent to the second LED unit, the first enable signal and the second enable signal are out-of-phase, and the second enable signal is a half cycle delayed from the first enable signal.

18. The driving circuit of claim 13, wherein the first LED unit and the second LED unit are arranged in a row or a column.

19. The driving circuit of claim 13, further comprising a plurality of data lines shared by the first pixel circuit and the second pixel circuit, wherein the data lines provide the first data signal to the first pass switch and provide the second data signal to the second pass switch.

* * * * *